US012568811B2

(12) United States Patent
Choi et al.

(10) Patent No.: US 12,568,811 B2
(45) Date of Patent: Mar. 3, 2026

(54) SEMICONDUCTOR DEVICE AND METHOD OF MANUFACTURING SEMICONDUCTOR DEVICE

(71) Applicant: SAMSUNG ELECTRONICS CO., LTD., Suwon-si (KR)

(72) Inventors: Jaemyung Choi, Busan (KR); Kyoungwoo Lee, Hwaseong-si (KR); Nayon Kim, Hwaseong-si (KR); Seonghun Lim, Suwon-si (KR); Sungyup Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 861 days.

(21) Appl. No.: 17/672,990

(22) Filed: Feb. 16, 2022

(65) Prior Publication Data
US 2023/0005838 A1 Jan. 5, 2023

(30) Foreign Application Priority Data
Jun. 30, 2021 (KR) ........................ 10-2021-0085585

(51) Int. Cl.
*H01L 23/522* (2006.01)
*H01L 21/033* (2006.01)
(Continued)

(52) U.S. Cl.
CPC ...... *H01L 23/5226* (2013.01); *H01L 21/0337* (2013.01); *H01L 21/76877* (2013.01); *H01L 23/528* (2013.01); *H01L 23/5286* (2013.01)

(58) Field of Classification Search
CPC ........................ H01L 23/5283; H01L 23/5286
See application file for complete search history.

(56) References Cited

U.S. PATENT DOCUMENTS 5,459,093 A * 10/1995 Kuroda .................. H10D 89/10
716/54
9,292,647 B2 3/2016 Yuan et al.
(Continued)

FOREIGN PATENT DOCUMENTS

KR 10-2019-0120991 A 10/2019
KR 10-2021-0049252 A 5/2021
(Continued)

OTHER PUBLICATIONS

Extended European Search Report dated Feb. 8, 2023 for corresponding EP 22176466.5.

*Primary Examiner* — Amar Movva
(74) *Attorney, Agent, or Firm* — Wolf, Greenfield & Sacks, P.C.

(57) ABSTRACT

A semiconductor device includes a lower structure, a first interlayer dielectric (ILD) on the lower structure, first pattern regions extending inside the first ILD in a first direction, the first pattern regions being spaced apart from each other in a second direction perpendicular to the first direction, each of the first pattern regions including at least one first pattern, and both ends of the at least one first pattern in the first direction being concave, and second pattern regions extending inside the first ILD in the first direction, the second pattern regions being spaced apart from each other in the second direction and alternating with the first pattern regions in the second direction, and each of the second pattern regions including at least one second pattern.

15 Claims, 27 Drawing Sheets

100B

(51) Int. Cl.
    *H01L 21/768*     (2006.01)
    *H01L 23/528*     (2006.01)

(56)            References Cited

U.S. PATENT DOCUMENTS

| 9,831,272 | B2 | 11/2017 | Chen et al. |
| 9,985,014 | B2 | 5/2018 | Xu et al. |
| 10,002,223 | B2 | 6/2018 | Jeong |
| 10,734,383 | B2 | 8/2020 | Smayling et al. |
| 10,878,162 | B2 | 12/2020 | Peng et al. |
| 2015/0301447 | A1 | 10/2015 | Shieh et al. |
| 2017/0116365 | A1 | 4/2017 | Cheng et al. |
| 2018/0315601 | A1 | 11/2018 | Peng et al. |
| 2019/0318698 | A1 | 10/2019 | Seo et al. |
| 2019/0318968 | A1* | 10/2019 | Seo ...................... H01L 21/565 |

FOREIGN PATENT DOCUMENTS

| TW | 202002076 A | 1/2020 |
| TW | 202013451 A | 4/2020 |

* cited by examiner

100A

I2-I2'

A1

II – II'

100C 111   12   112          22          112   P1

11   112(DP)   11   21   112          12   111   P2

100D

SEMICONDUCTOR DEVICE AND METHOD OF MANUFACTURING SEMICONDUCTOR DEVICE

CROSS-REFERENCE TO RELATED APPLICATION

This application claims benefit of priority to Korean Patent Application No. 10-2021-0085585, filed on Jun. 30, 2021, in the Korean Intellectual Property Office, the disclosure of which is incorporated herein by reference in its entirety.

BACKGROUND

1. Field

Embodiments relate to a semiconductor device and a method of manufacturing a semiconductor device.

2. Description of the Related Art

According to the trend for high performance, high speed, and/or multifunctionality of semiconductor devices, demand for miniaturization of elements (e.g., transistors) and interconnections inside semiconductor devices has increased to increase the degree of integration of the semiconductor devices. However, implementation of fine interconnections degrades a process margin due to various environments (e.g., a change in pitch) between the fine interconnections and degrades performance due to an increase in interconnection density.

SUMMARY

According to an aspect of embodiments, a semiconductor device includes: a lower structure; a first interlayer dielectric (ILD) (or a first interlayer insulating layer) on the lower structure; and a plurality of first pattern regions and a plurality of second pattern regions extending inside the first ILD in a first direction, spaced apart from each other and alternately disposed in a second direction, perpendicular to the first direction, and respectively including at least one first pattern and at least one second pattern, wherein both ends of the at least one first pattern in the first direction are concave.

According to another aspect of embodiments, a semiconductor device includes: a lower structure; a first pattern extending on the lower structure in a first direction, both ends thereof being concave; and a second pattern extending on the lower structure in parallel to the first pattern, being adjacent to the first pattern in a second direction, perpendicular to the first direction, both ends thereof being concave, wherein one side surface of the second pattern facing the first pattern has a first portion overlapping the first pattern in the second direction and a second portion not overlapping the first pattern, and the first and second portions are substantially coplanar with each other.

According to yet another aspect of embodiments, a semiconductor device includes: a pair of power interconnections extending in a first direction and spaced apart from each other in a second direction, perpendicular to the first direction; a plurality of first and second pattern regions extending in the first direction between the pair of power interconnections, alternately arranged in the second direction, and including a plurality of first and second patterns separated by blocking gaps in the first direction, respectively; and a plurality of spacer regions arranged between the pair of power interconnections and the plurality of first and second pattern regions, wherein a pattern density of the plurality of first patterns is lower than a pattern density of the plurality of second patterns in a region between the pair of power interconnections.

According to still another aspect of embodiments, a method of manufacturing a semiconductor device includes: sequentially forming a dielectric layer, a first hard mask, and a first patterning layer on a lower structure; patterning the first patterning layer to form a non-mandrel region extending continuously in a first direction and a mandrel pattern defined by the non-mandrel region; forming a preliminary spacer layer on the non-mandrel region and the mandrel pattern; forming a pattern block layer dividing the non-mandrel region into a plurality of first pattern lines on the preliminary spacer layer; etching the preliminary spacer layer exposed from the pattern block layer to form a spacer layer extending along a side wall of the mandrel pattern; sequentially forming a second hard mask covering the mandrel pattern, the spacer layer, and the pattern block layer and a second patterning layer on the second hard mask; patterning the second patterning layer to form a mandrel etched region overlapping the mandrel pattern in a vertical direction and extending in parallel to the mandrel pattern and a mandrel cut pattern dividing the mandrel etched region into a plurality of second pattern lines; etching the second hard mask and the mandrel pattern using the patterned second patterning layer; removing the second patterning layer and the second hard mask layer and patterning the first hard mask using the spacer layer, the pattern block layer, and the mandrel etched pattern; forming a plurality of first trenches corresponding to the plurality of first pattern lines and a plurality of second trenches corresponding to the plurality of second pattern lines on the dielectric layer using the patterned first hard mask; and plating a metallic material inside the plurality of first and second trenches to form a plurality of first and second patterns.

BRIEF DESCRIPTION OF DRAWINGS

Features will become apparent to those of skill in the art by describing in detail exemplary embodiments with reference to the attached drawings, in which.

3

Figure 7:
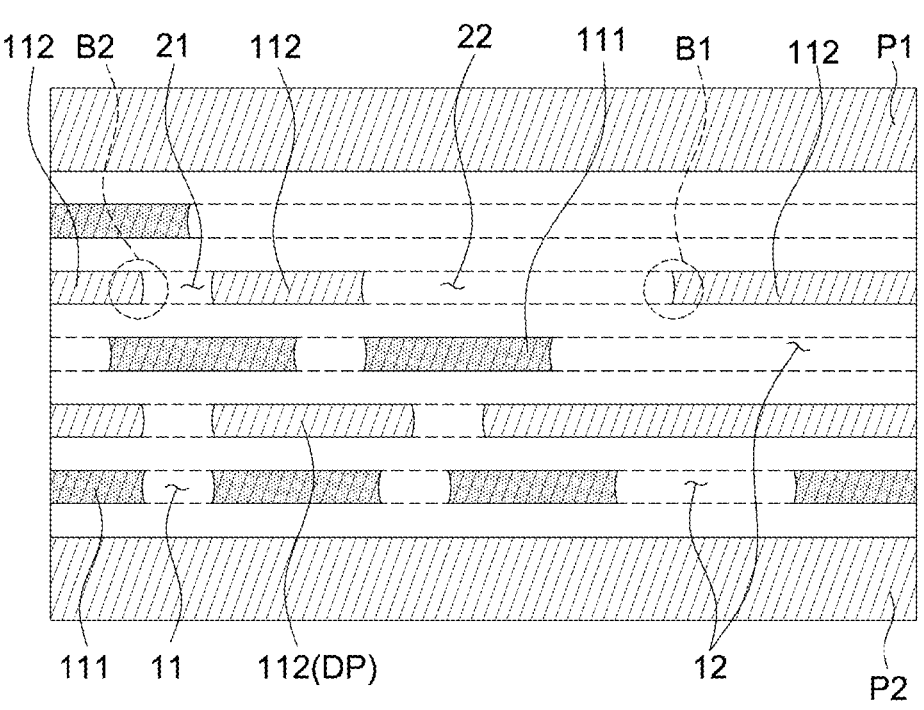
FIG. 7 is a plan view of a semiconductor device according to an embodiment.
Figure 7:
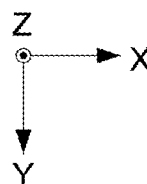
Figure 10A:
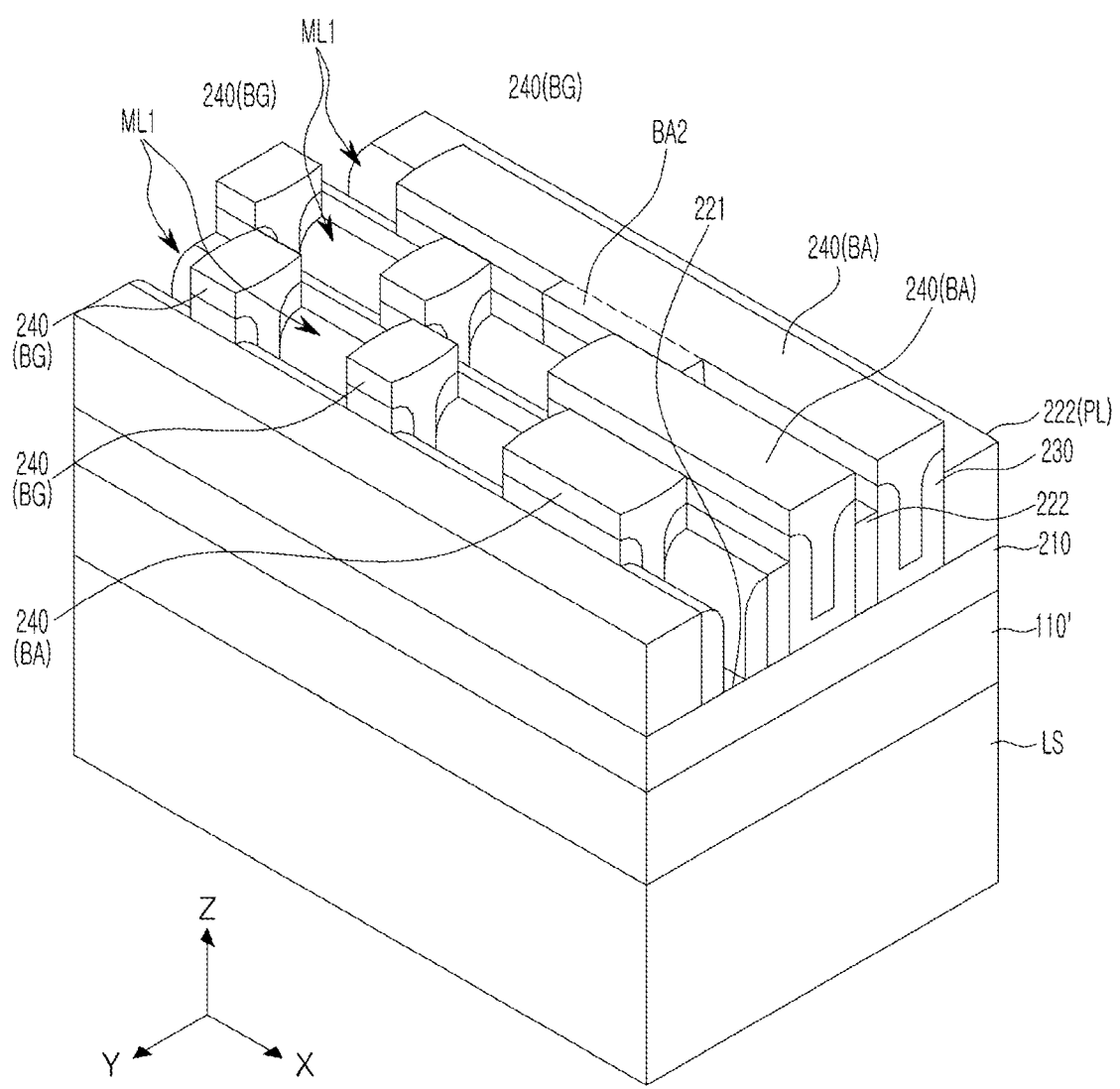
Figure 10B:
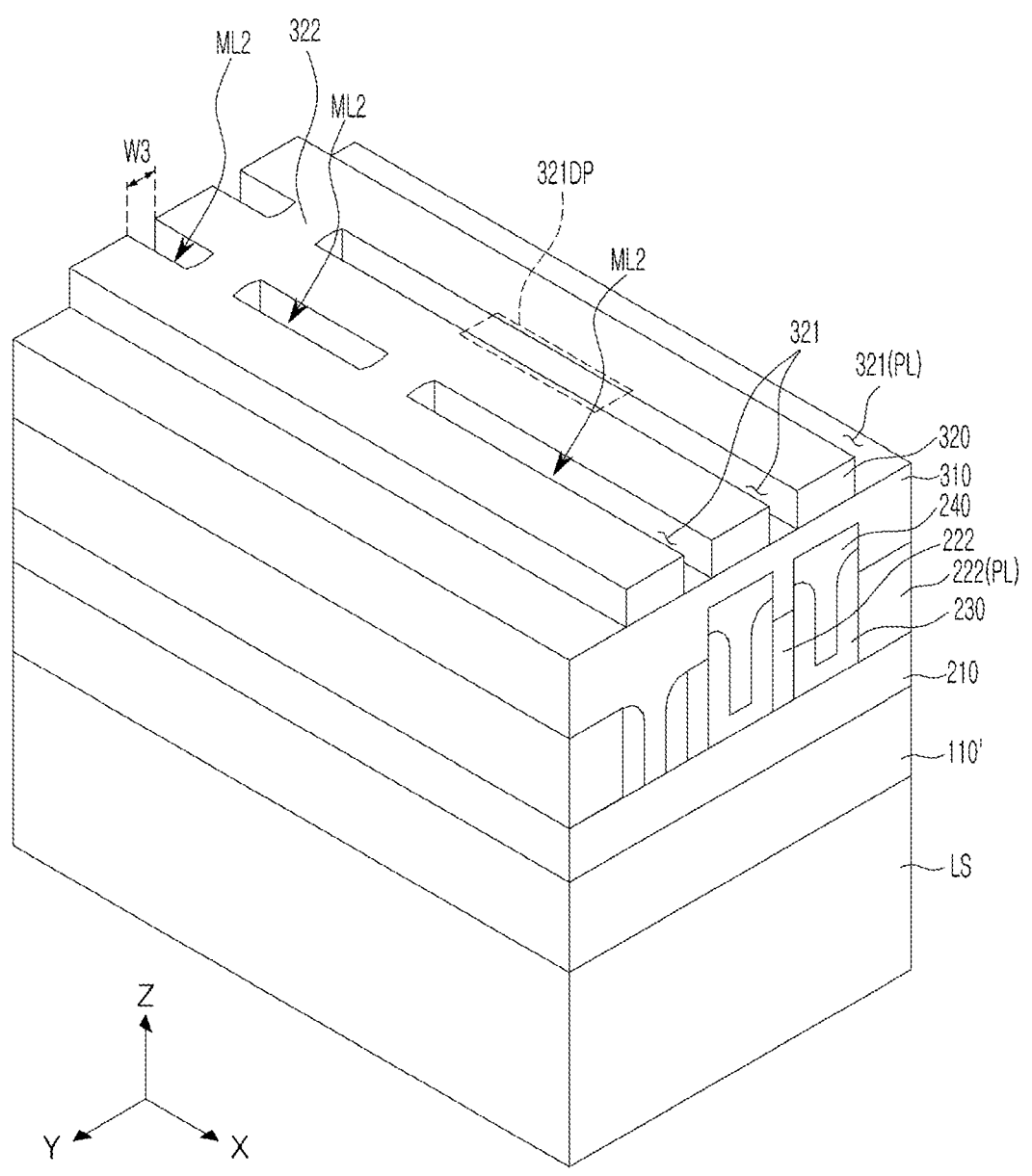
Figure 10C:
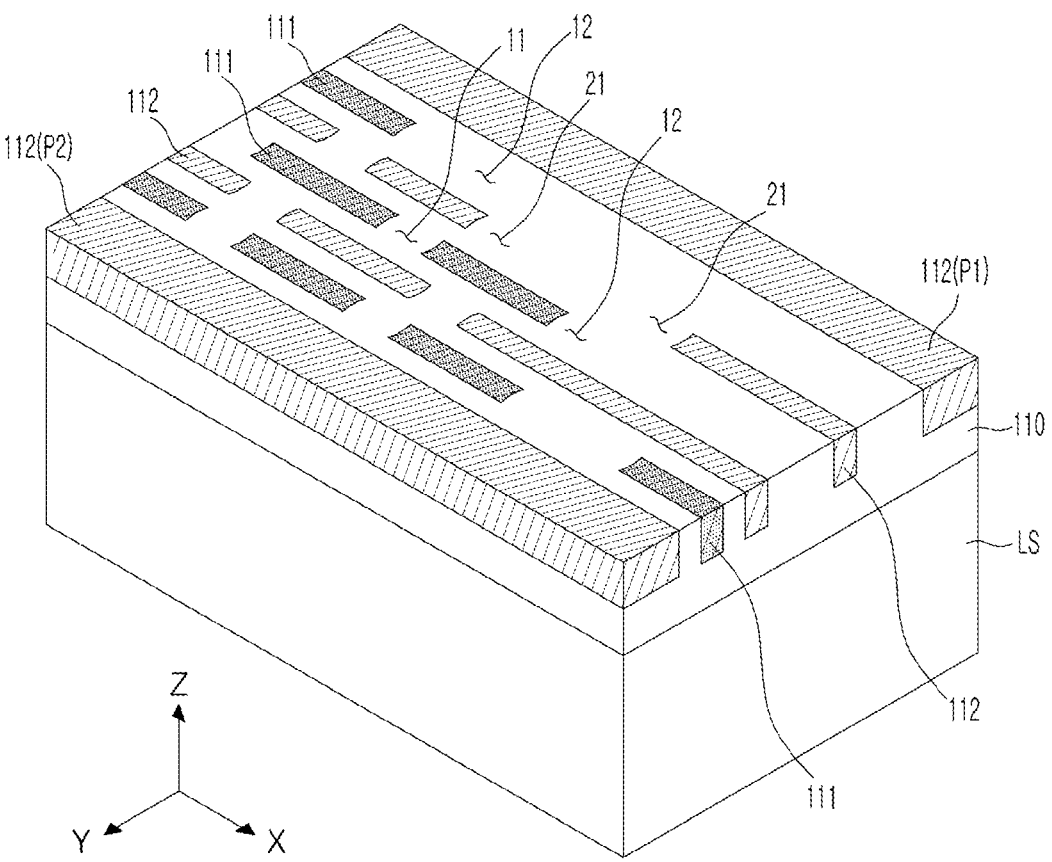

FIGS. 10A to 10C are perspective views of stages in a process of manufacturing the semiconductor device of FIG. 7.

DETAILED DESCRIPTION

Figure 1:
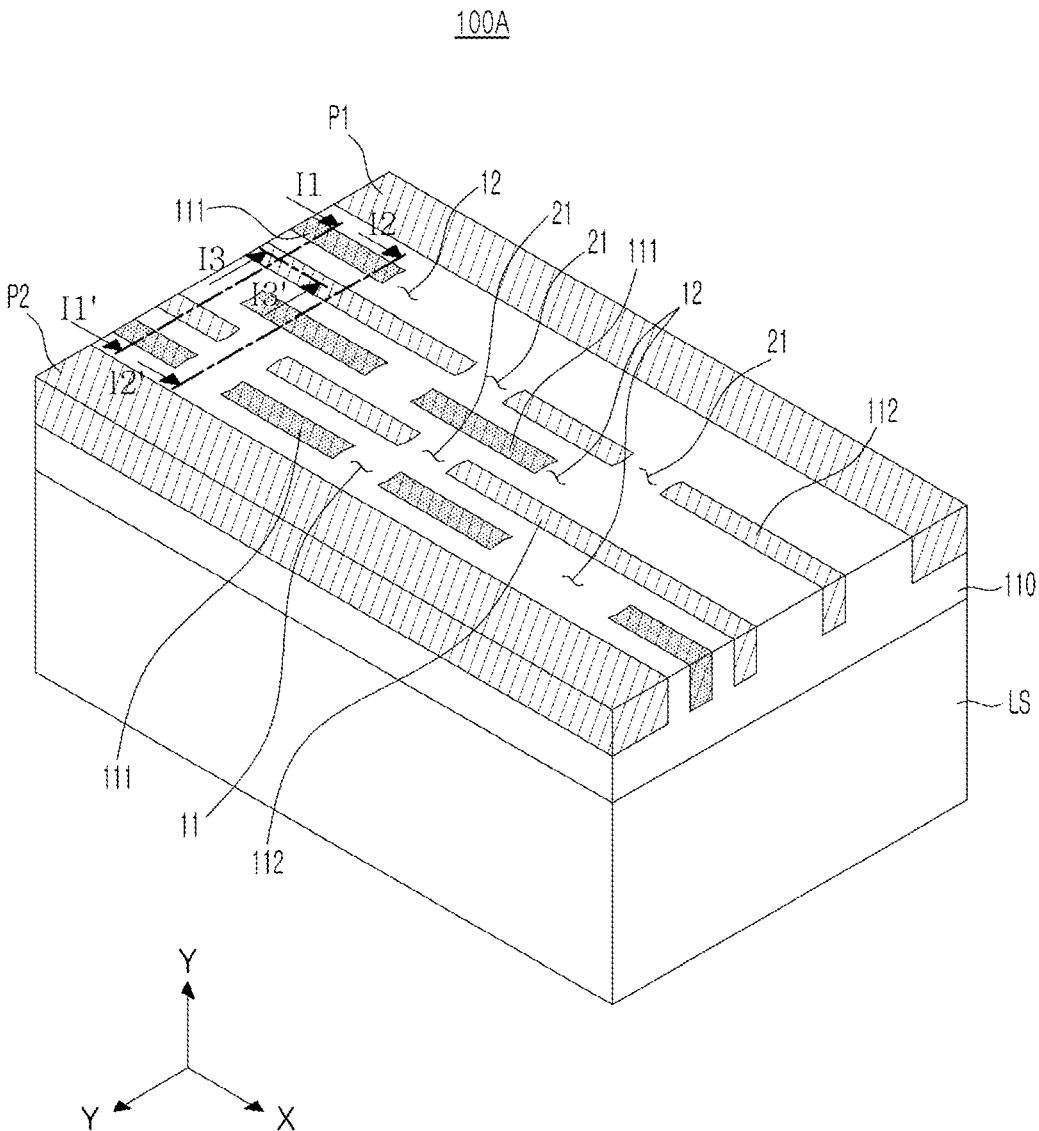
FIG. 1 is a perspective view of a semiconductor device according to an embodiment.

FIG. 1 is a perspective view illustrating a semiconductor device 100A according to an embodiment.

Referring to FIG. 1, the semiconductor device 100A according to an embodiment may include a lower structure LS, a first interlayer dielectric (ILD) 110 (i.e., a first inter-layer insulating layer) on the lower structure LS, and at least one first pattern 111 and at least one second pattern 112 inside the first ILD 110. In embodiments, variables affecting a process margin, e.g., variations of pitches of fine patterns, are minimized during a photolithography and etching process of forming fine patterns of a semiconductor device, thereby providing the semiconductor device 100A having improved process margin and yield.

According to embodiments, the semiconductor device 100A may include a fine pattern in which patterns having different shapes are alternately arranged. For example, the semiconductor device 100A according to an embodiment may include the first pattern 111 and the second pattern 112 extending in a first direction (X-axis direction) and alter-nately arranged in a second direction (Y-axis direction). In this case, shapes of the ends of the first pattern 111 and the second pattern 112 in the first direction (X-axis direction) may be different from each other. For example, one of the first pattern 111 and the second pattern 112 (e.g., the first pattern 111) may have both ends concave. Such structural characteristics may be implemented by a method of forming a fine pattern according to embodiments, which will be described in detail below with reference to FIGS. 9A to 9I.

The lower structure LS may be a semiconductor substrate with semiconductor elements, e.g., planar metal oxide semi-conductor field effect transistors (MOSFETs), FinFETs in which an active region has a fin structure, multi bridge channel FETs (MBCFET™) including a plurality of verti-cally stacked channels, gate-all-around transistors, or verti-cal FETs (VFETs). A connection relationship between the lower structure LS and the first pattern 111 and the second pattern 112 will be described I detail below with reference to FIGS. 2A to 2C.

The first ILD 110 may be disposed on the lower structure LS and may include, e.g., silicon oxide, silicon nitride, or a low-k insulating material. The first ILD 110 may be formed to cover side surfaces and lower surfaces of the first pattern 111 and the second pattern 112. The first ILD 110 insulates the first pattern 111 and the second pattern 112 from the lower structure LS, and the first pattern 111 and the second pattern 112 may be electrically connected to the lower structure LS through a lower via ('V0' in FIGS. 2A to 2C) penetrating through a portion of the first ILD 110. For example, the first ILD 110 may be formed such that a portion thereof covering side surfaces of the first pattern 111 and the second pattern 112 and a portion thereof covering lower surfaces of the first pattern 111 and the second pattern 112 are distinguished from each other by an interface.

The first pattern 111 and the second pattern 112 may extend in the first direction (X-axis direction) on the lower structure LS and alternately disposed adjacent to each other in the second direction (Y-axis direction). The shapes of both ends of the first pattern 111 and the second pattern 112 may be different from each other in the first direction (X-axis direction). The first pattern 111 and the second pattern 112 may be provided as a plurality of first patterns 111 and a plurality of second patterns 112 separated in the first direc-tion (X-axis direction) according to functions. The plurality of first patterns 111 and the plurality of second patterns 112 may be separated at predetermined intervals by first and second blocking gaps 11 and 21, respectively.

Figure 9A:
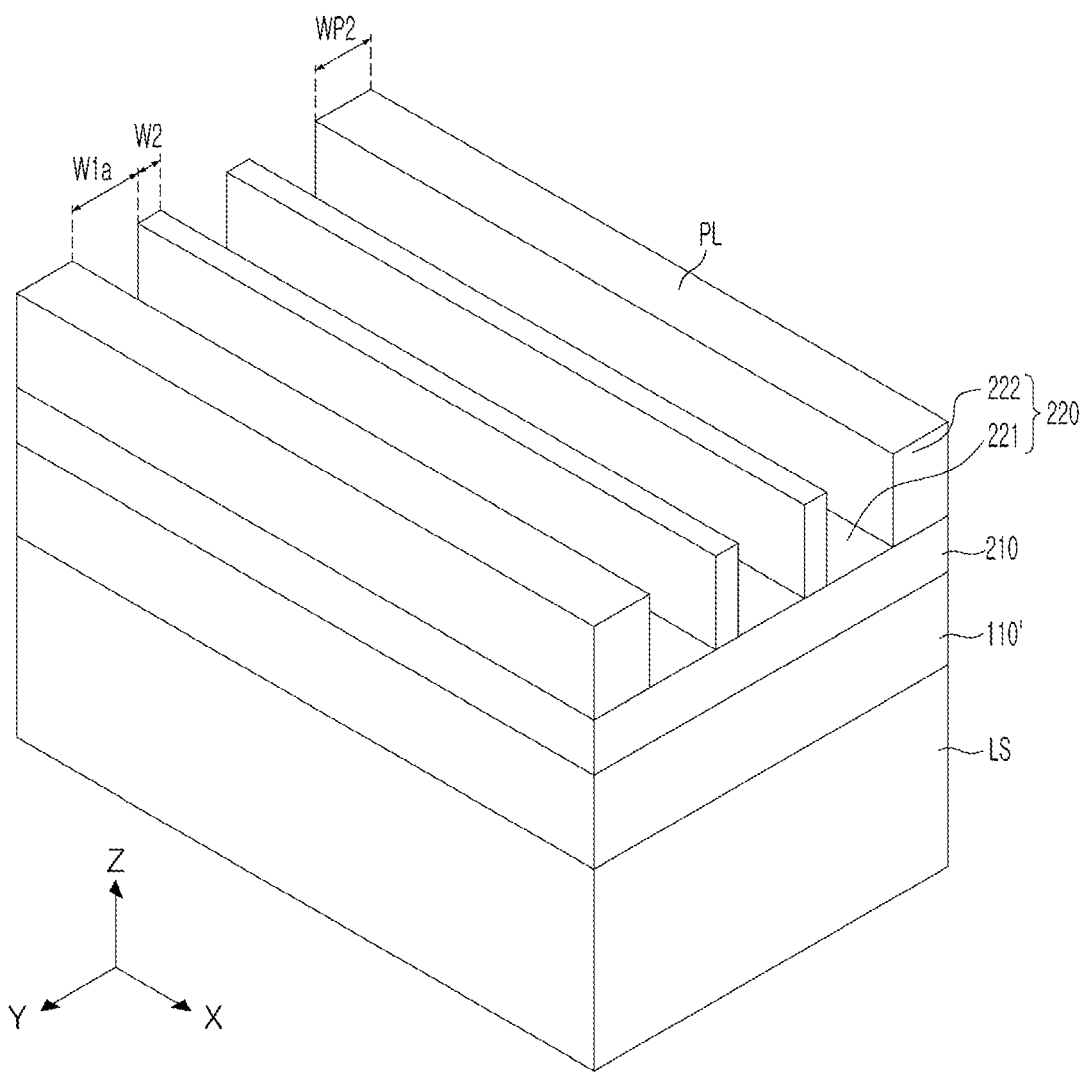
FIGS. 9A to 9I are perspective views of stages in a process of manufacturing a semiconductor device according to an embodiment.
Figure 9B:
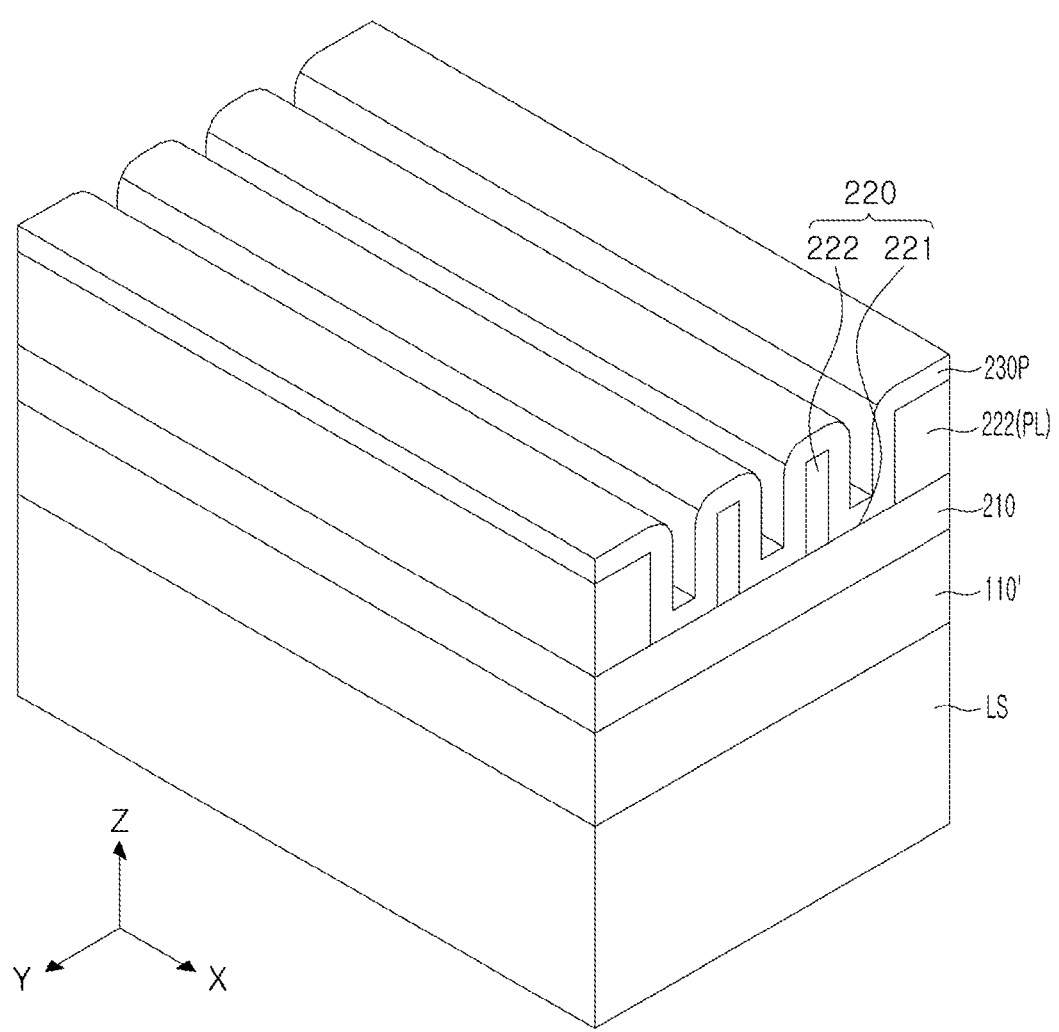
Figure 9C:
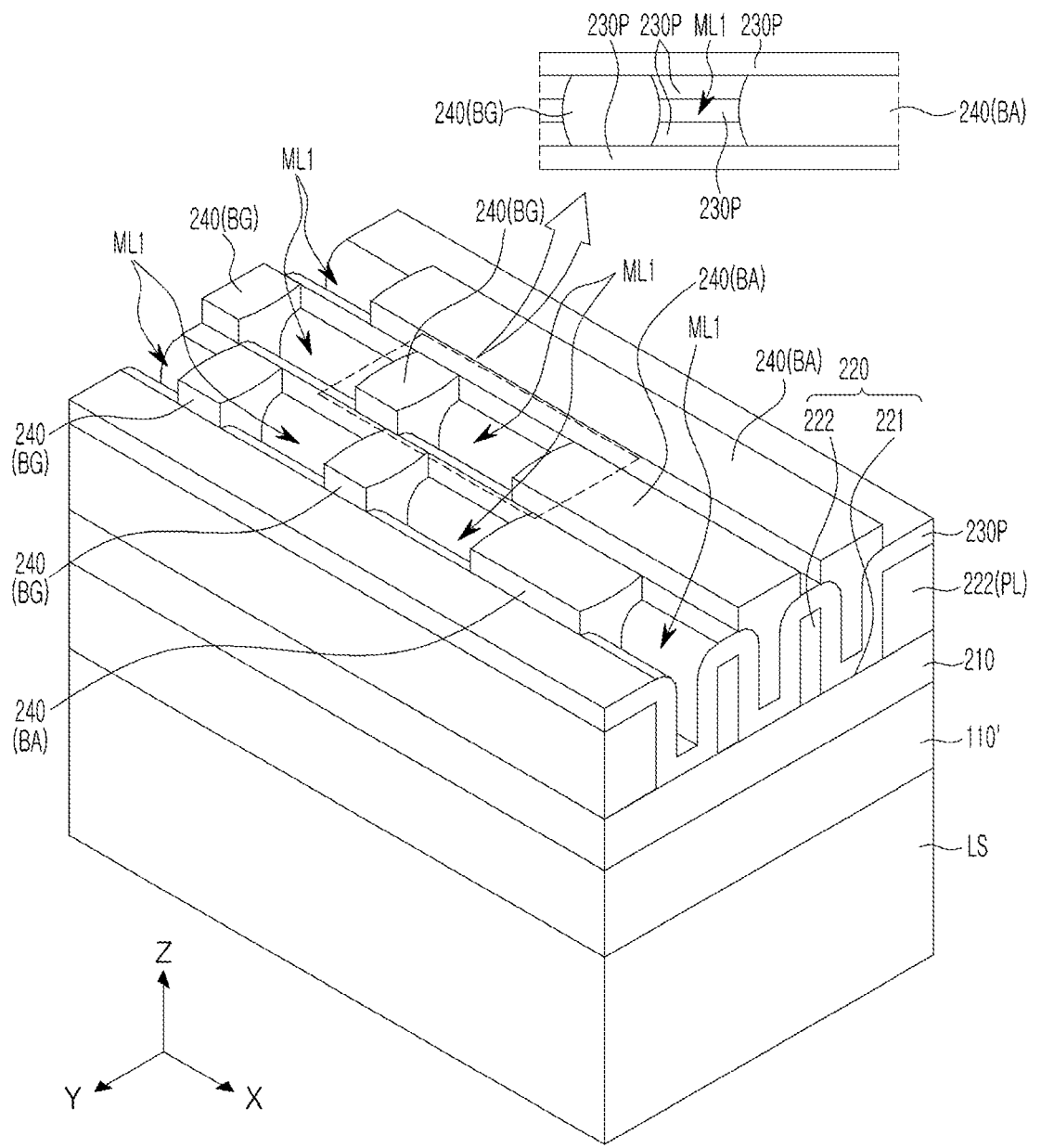
Figure 9D:
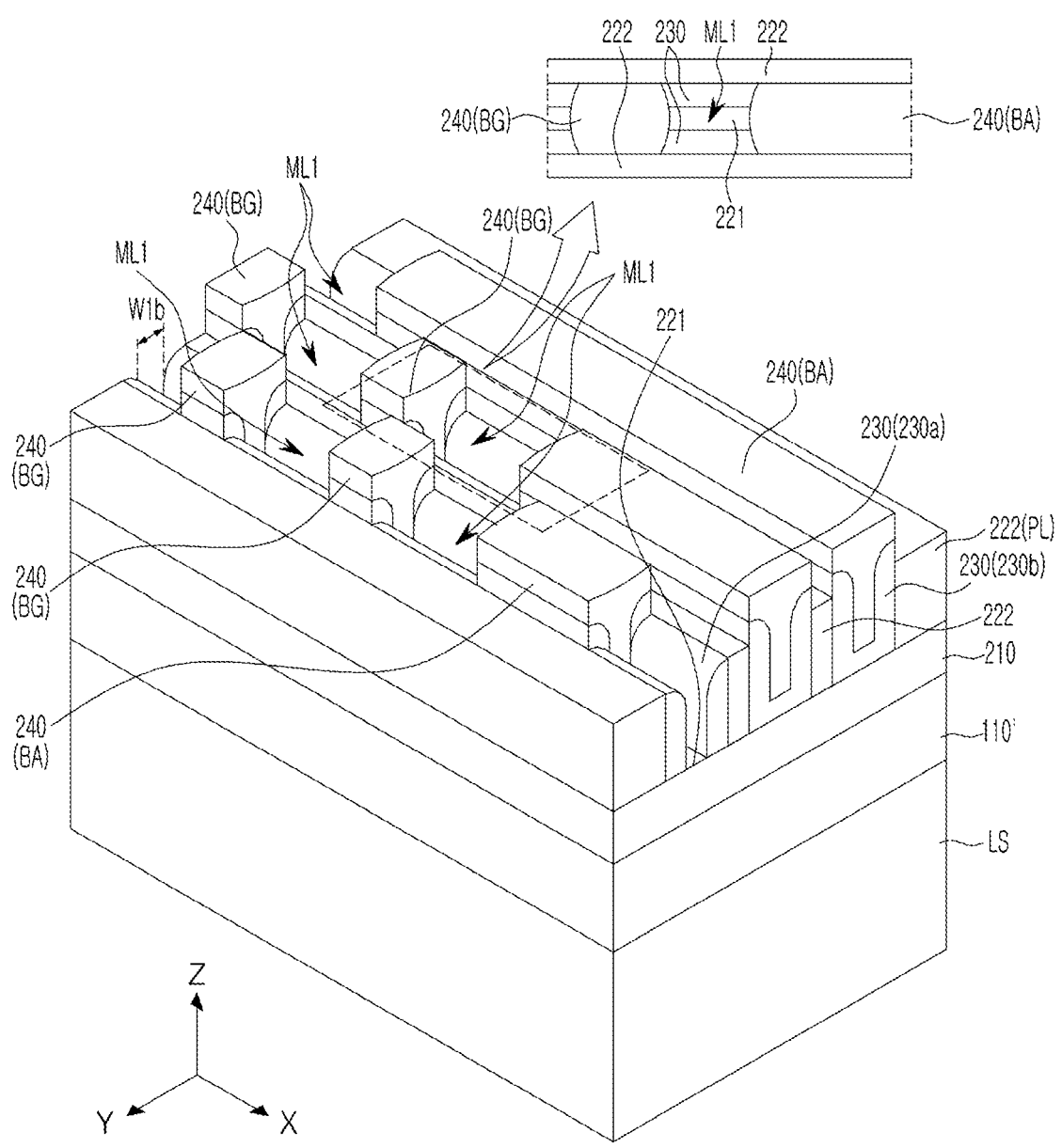
Figure 9E:
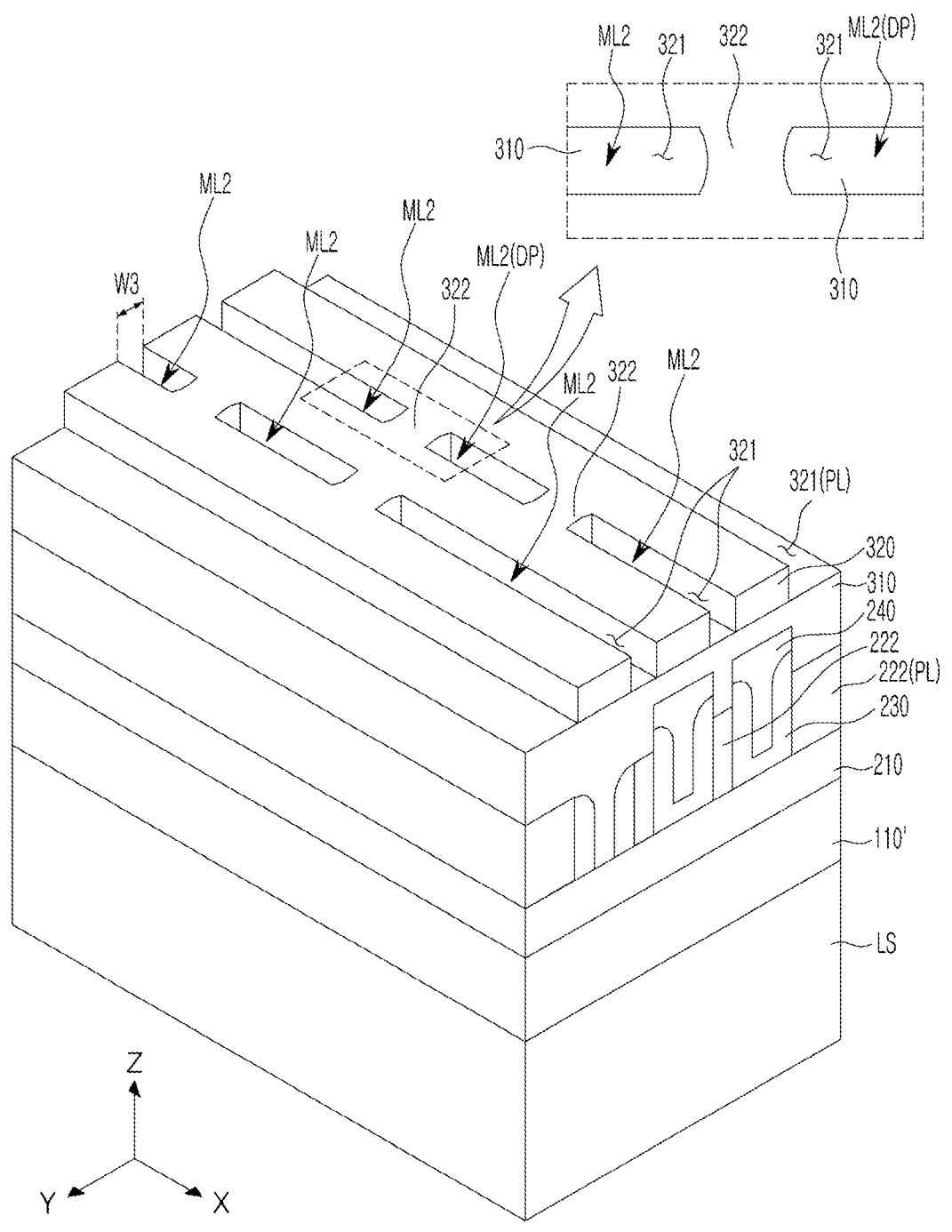

In embodiments, etch patterns on a photomask corre-sponding to the first pattern 111 and the second pattern 112 are formed to be dense, thereby uniformly creating a process environment in the photolithography and etching process (see FIGS. 9A and 9E). Accordingly, at least one of the plurality of first patterns 111 and the plurality of second patterns 112 (e.g., the plurality of second patterns 112) may be separated by the second blocking gap 21 and repeatedly arranged. In addition, according to embodiments, by remov-ing a dummy pattern included in the other of the plurality of first patterns 111 and the plurality of second patterns 112, a degradation of performance due to an increase in the pattern density may be prevented (see FIGS. 9D and 9G). For example, the blocking region 12 providing a spacing dis-tance greater than that of the first blocking gap 11, e.g., a greater length along the first direction X, may be positioned at one end of at least some of the plurality of first patterns 111. The blocking region 12 is a region in which the first pattern 111 is not formed and may be filled with the first ILD 110.

Accordingly, the plurality of second patterns 112 may include at least one dummy pattern ('DP' in FIG. 3), and a pattern density of the plurality of first patterns 111 on the lower structure LS may be lower than a pattern density of the plurality of second patterns 112. Here, the "pattern density" may refer to an area occupied by the plurality of first and second patterns 111 and 112 within a predetermined area (e.g., an area of a standard cell). For example, the plurality of first and second patterns 111 and 112 may be arranged between a pair of power interconnections P1 and P2 spaced apart from each other in the second direction (Y-axis direc-tion), and in the region between the pair of power intercon-nections P1 and P2, the pattern density of the plurality of first patterns 111 may be less than the pattern density of the plurality of second patterns 112, e.g., a total area occupied by the plurality of first patterns 111 may be less than a total area occupied by plurality of second patterns 112 within the predetermined area between pair of power interconnections P1 and P2. In addition, in the process of forming the fine pattern using the first and second blocking gaps 11 and 21 and the blocking region 12, shapes of the ends of the plurality of first and second patterns 111 and 112 adjacent to each other may be different from each other. For example, both ends of, e.g., each of, the plurality of first patterns 111 may be concave, and both ends of, e.g., each of, the plurality of second patterns 112 may be convex.

Figure 2A:
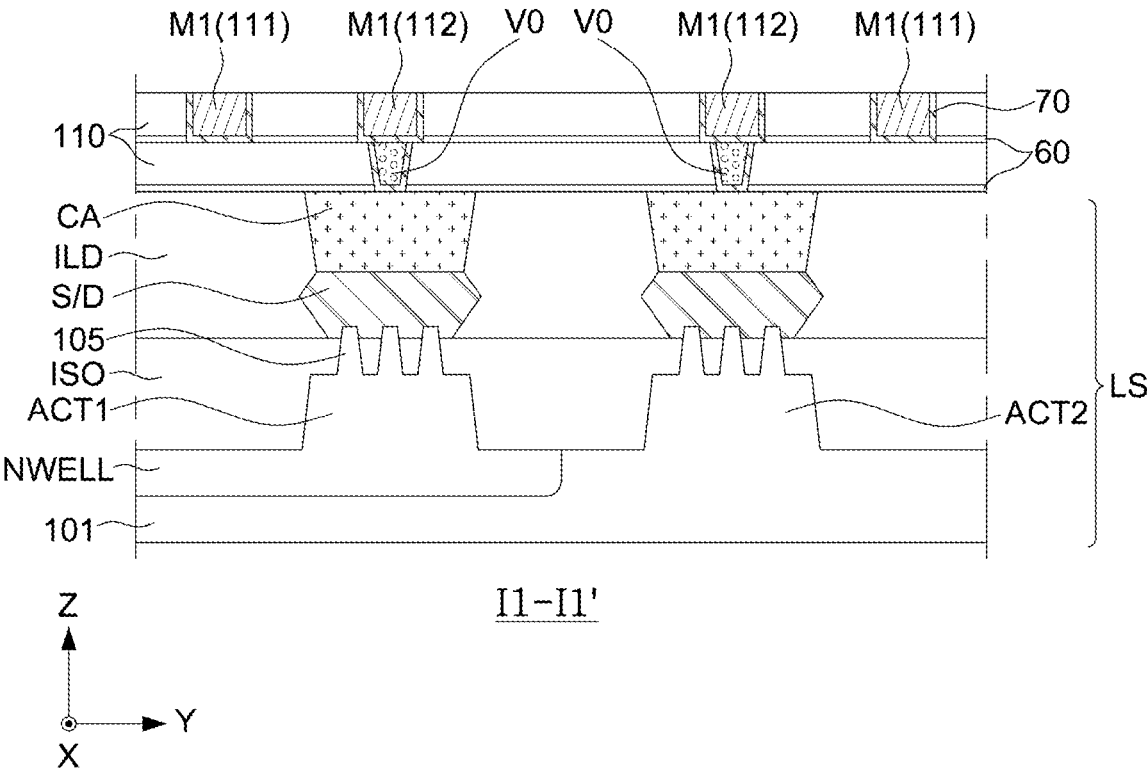
FIGS. 2A to 2C are cross-sectional views along lines I1-I1', I2-I2', and I3-I3' of FIG. 1, respectively.
Figure 2B:
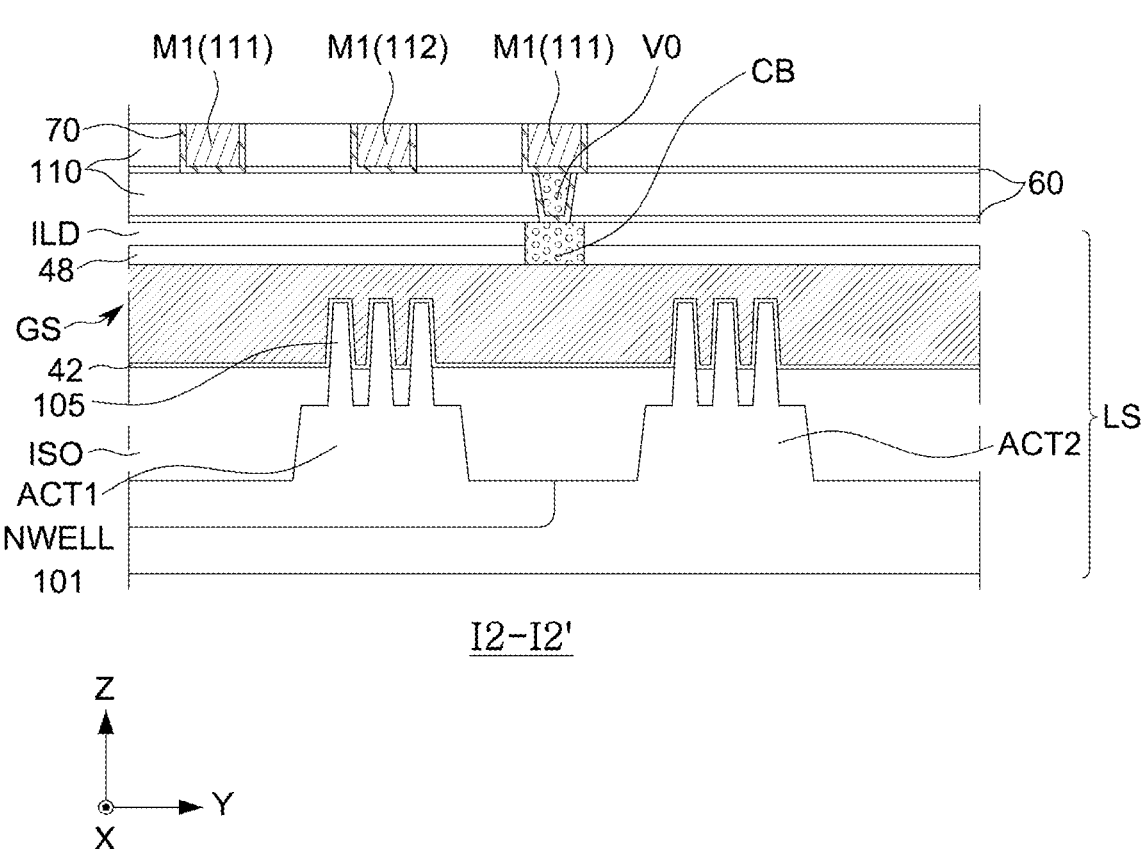
Figure 2C:
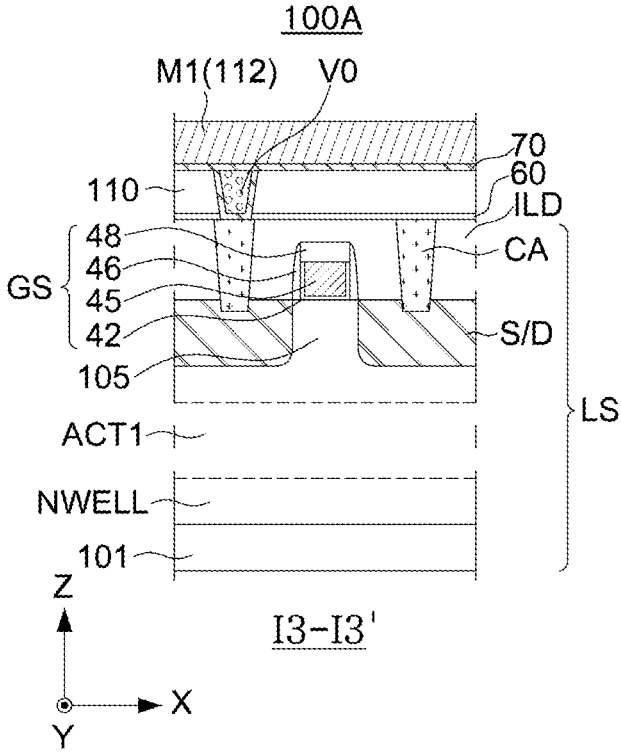
Figure 2D:
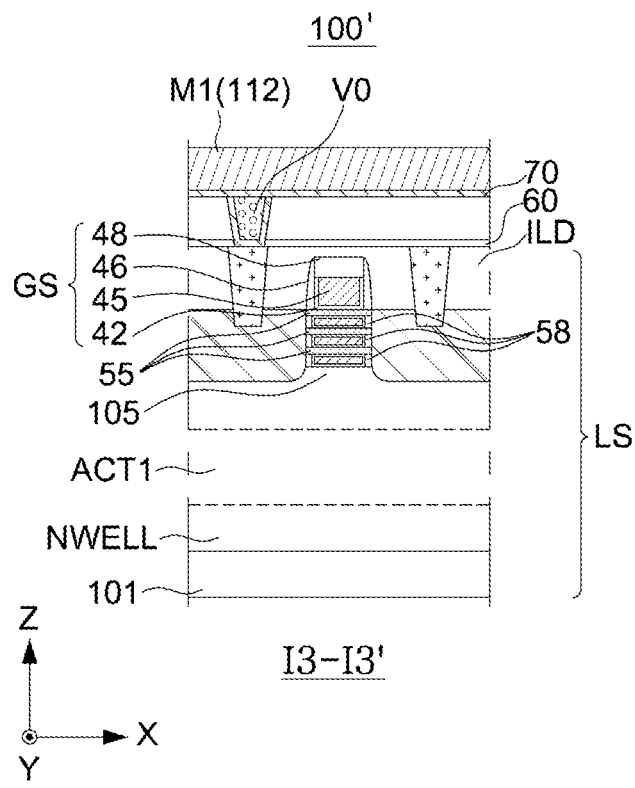
FIG. 2D is a cross-sectional view of a gate structure applicable to an example embodiment.

Hereinafter, a connection relationship between the lower structure LS and the first pattern 111 and the second pattern 112 is described with reference to FIGS. 2A to 2D along with FIG. 1. FIGS. 2A to 2C are cross-sectional views along lines I1-I1', I2-I2', and I3-I3' of FIG. 1, respectively, and FIG. 2D is a cross-sectional view of a gate structure applicable to an example embodiment. FIGS. 2A to 2D merely illustrate the relationship of the physical and electrical connections between the fine patterns and the lower structure LS intro-duced in the embodiments of embodiments, and are not limited to the form illustrated in FIGS. 2A to 2D.

Referring to FIGS. 2A to 2C, the semiconductor device 100A according to an example embodiment may include a semiconductor substrate 101, active regions ACT1 and ACT2, each including active fins 105, a device isolation layer ISO, source/drain regions S/D, a gate structure GS, a lower ILD, a contact structure CA, a gate contact structure CB, the first ILD 110, a lower via V0, and a first conductive structure M1. The first conductive structure M1 may be understood as corresponding to the first and second patterns 111 and 112 illustrated in FIG. 1. At least some of the plurality of first and second patterns 111 and 112 illustrated in FIG. 1 may be electrically connected to the source/drain regions S/D or the gate structure GS through the lower via V0. The semiconductor device 100A according to an example embodiment may include FinFET elements in which the active regions ACT1 and ACT2 include the active fins 105 in the form of fins.

The semiconductor substrate 101 may include a semiconductor material, e.g. a group IV semiconductor, a group III-V compound semiconductor, or a group II-VI compound semiconductor. For example, the group IV semiconductor may include silicon, germanium, or silicon-germanium. The semiconductor substrate 101 may be provided as, e.g., a bulk wafer, an epitaxial layer, a silicon on insulator (SOI) layer, a semiconductor on insulator (SeOI) layer, or the like. The semiconductor substrate 101 may include doped regions, e.g., an N well region NWELL.

The device isolation layer ISO may define the active regions ACT1 and ACT2 in the semiconductor substrate 101. The device isolation layer ISO may be formed by, e.g., a shallow trench isolation (STI) process. As illustrated in FIG. 2A, the device isolation layer ISO may include a region extending deeper to a lower portion of the semiconductor substrate 101 between the adjacent active regions ACT1 and ACT2, but is not limited thereto. In some embodiments, the device isolation layer ISO may have a curved upper surface having a higher level toward the active fins 105. The device isolation layer ISO may be formed of an insulating material, e.g., oxide, nitride, or a combination thereof.

The active regions ACT1 and ACT2 are defined by the device isolation layer ISO in the semiconductor substrate 101 and may be disposed to extend in the first direction (X-axis direction). The active fins 105 may protrude from the semiconductor substrate 101. The upper ends of the active fins 105 may be disposed to protrude by a predetermined height from the upper surface of the device isolation layer ISO. The active fins 105 may be formed as a part of the semiconductor substrate 101 or may include an epitaxial layer grown from the semiconductor substrate 101. The active fins 105 may be partially recessed on both sides of the gate structures GS, and the source/drain regions S/D may be disposed on the recessed active fins 105. In some embodiments, the active regions ACT1 and ACT2 may have doped regions including impurities. For example, the active fins 105 may include impurities diffused from the source/drain regions S/D in a region in contact with the source/drain regions S/D. In example embodiments, the active fins 105 may be omitted, and in this case, the active regions ACT1 and ACT2 may have a structure having a flat upper surface.

The source/drain regions S/D may be disposed on the recess regions, in which the active fins 105 are recessed, on both sides of the gate structures GS. The source/drain regions S/D may be provided as a source region or a drain region of the transistors. As illustrated in FIG. 2C, upper surfaces of the source/drain regions S/D may be positioned on a height level the same as or similar to that of the lower surfaces of the gate structures GS. However, the relative heights of the source/drain regions S/D and the gate structures GS may be variously changed according to embodiments.

As illustrated in FIG. 2A, the source/drain regions S/D may be merged to be connected to each other between the active fins 105 adjacent in the second direction (Y-axis direction), but is not limited thereto. As illustrated in FIG. 2A, the source/drain regions S/D may have angled side surfaces in a cross-section in the second direction (Y-axis direction). However, in embodiments, the source/drain regions S/D may have various shapes, e.g., a polygonal shape, a circular shape, an oval shape, and/or a rectangular shape.

The source/drain regions S/D may be formed of an epitaxial layer, and may include, e.g., silicon (Si), silicon germanium (SiGe), or silicon carbide (SiC). In addition, the source/drain regions S/D may further include impurities, e.g., arsenic (As) and/or phosphorus (P). In example embodiments, the source/drain regions S/D may include a plurality of regions including elements and/or doped elements having different concentrations.

As illustrated in FIG. 2B, the gate structures GS may be disposed to cross the active regions ACT1 and ACT2 on top of the active regions ACT1 and ACT2 to extend in the second direction (Y-axis direction). Channel regions of transistors may be formed in the active fins 105 crossing the gate structures GS. As illustrated in FIG. 2C, the gate structure GS may include a gate insulating layer 42, a gate electrode layer 45, gate spacer layers 46, and a gate capping layer 48.

The gate insulating layer 42 may be disposed between the active fin 105 and the gate electrode layer 45. In example embodiments, the gate insulating layer 42 may be formed of a plurality of layers or may be disposed to extend onto a side surface of the gate electrode layer 45. The gate insulating layer 42 may include, e.g., an oxide, a nitride, or a high-k material. The high-k material may refer to a dielectric material having a higher dielectric constant than that of a silicon oxide layer ($SiO_2$).

The gate electrode layer 45 may include a conductive material, e.g., a metal nitride such as titanium nitride (TiN), tantalum nitride (TaN), or tungsten nitride (WN), and/or metallic material such as aluminum (Al), tungsten (W), or molybdenum (Mo), or a semiconductor material such as doped polysilicon. The gate electrode layer 45 may be formed of two or more multilayer structures. The gate electrode layer 45 may be disposed to be separated from each other in the second direction (Y-axis direction) between at least some adjacent transistors according to the circuit configuration of the semiconductor device 100A. For example, the gate electrode layer 45 may be separated by a separate gate isolation layer.

The gate spacer layers 46 may be disposed on opposite, e.g., both, sides of the gate electrode layer 45. The gate spacer layers 46 may insulate the source/drain regions S/D from the gate electrode layer 45. The gate spacer layers 46 may have a multilayer structure according to embodiments. The gate spacer layers 46 may be formed of, e.g., oxide, nitride, or oxynitride, and in particular, a low-k film. The gate spacer layers 46 may include, e.g., at least one of SiO, SiN, SiCN, SiOC, SiON, and SiOCN.

The gate capping layer 48 may be disposed on the gate electrode layer 45, and the lower surface and side surfaces thereof may be surrounded by the gate electrode layer 45 and the gate spacer layers 46, respectively. The gate capping layer 48 may be formed of, e.g., oxide, nitride, and oxynitride.

The lower ILD may be disposed to cover the source/drain regions S/D and the gate structures GS. The lower ILD may include, e.g., at least one of an oxide, a nitride, and an oxynitride, and may include a low-k material.

The contact structure CA may be connected to the source/drain regions S/D through the lower ILD and apply an electrical signal to the source/drain regions S/D, e.g., the contact structure CA may penetrate through the lower ILD to directly contact the source/drain regions S/D. The gate contact structure CB may be connected to the gate electrode layer 45 through the lower ILD and the gate capping layer 48, and may apply an electrical signal to the gate electrode layer 45, e.g., the gate contact structure CB may penetrate through the lower ILD and through the gate capping layer 48 to directly contact the gate electrode layer 45. The contact structures CA may be disposed in corresponding recesses of the source/drain regions S/D to a predetermined depth (FIG. 2C), but are not limited thereto. The contact structure CA and the gate contact structure CB may include a conductive material, e.g., a metallic material such as tungsten (W), aluminum (Al), and copper (Cu) or a semiconductor material such as doped polysilicon. In some embodiments, the contact structure CA and the gate contact structure CB may include a barrier metal layer disposed along an outer surface thereof. Also, in some embodiments, the contact structure CA may further include a metal-semiconductor layer, e.g., a silicide layer, disposed at an interface in contact with the source/drain regions S/D, and the gate contact structure CB may further include a metal-semiconductor layer, e.g., a silicide layer, disposed on an interface in contact with the gate electrode layer 45.

The first ILD 110 may cover the contact structure CA and the gate contact structure CB and may be on the same level as that of an interconnection structure including the lower via V0 and the first conductive structure M1. The first ILD 110 may be formed of silicon oxide or a low-k material. The first ILD 110 may include, e.g., at least one of SiO, SiN, SiCN, SiOC, SiON, and SiOCN. In an example, the first ILD 110 may be divided into a plurality of insulating layers disposed on the same level as those of the lower via V0 and the first conductive structure M1. In this case, etch stop layers 60 may be disposed on a lower surface of each of the plurality of insulating layers. The etch stop layers 60 may function as etch stop layers during an etch process for forming the lower via V0 and the first conductive structure M1. The etch stop layers 60 may include a high-k material, e.g., silicon nitride or aluminum oxide.

The lower via V0 and the first conductive structure M1 constituting the interconnection structure of the semiconductor device 100A may be sequentially stacked and disposed on the lower structure LS. The first conductive structure M1 may be understood as an element corresponding to the power interconnections P1 and P2 and the first and second patterns 111 and 112 illustrated in FIG. 1. The interconnection structure may include at least one of a conductive material, e.g., aluminum (Al), copper (Cu), and tungsten (W). According to an embodiment, the interconnection structure may further include a plurality of vias and a plurality of conductive structures stacked in a vertical direction, e.g., in the Z direction, on the first conductive structure M1 (refer to the embodiment of FIG. 8A). In this case, the plurality of conductive structures may have a relatively large thickness as they are disposed on an upper portion, but embodiments are not limited thereto.

The interconnection structure may further include a barrier layer 70 disposed on lower surfaces of the first conductive structure M1 and the lower via V0. The barrier layer 70 may be disposed on a lower surface and a side surface of each of the lower via V0 and the first conductive structure M1. In FIGS. 2A to 2C, the interconnection structures M1 and V0 are illustrated as a single damascene structure, but may be formed in a dual damascene structure according to an embodiment. In this case, the barrier layers 70 may continuously extend from, e.g., the side surface and the lower surface of the first conductive structure M1 to the side surface and the lower surface of the lower via V0. The barrier layers 70 may include at least one of, e.g., titanium (Ti), tantalum (Ta), cobalt (Co), titanium nitride (TiN), and tantalum nitride (TaN).

Referring to FIG. 2D, a semiconductor device 100' may further include a plurality of channel layers 55 vertically spaced apart from each other, e.g., along the Z direction, on the active regions ACT1 and ACT2, and internal spacer layers 58 disposed in parallel with the gate electrode layer 45 between the plurality of channel layers 55. The semiconductor device 100' may include transistors having a gate-all-around structure in which the gate electrode layer 45 and the gate insulating layer 42 are disposed between the active fin 105 and the channel layers 55 and between the plurality of channel layers 55 having a nanosheet shape. For example, the semiconductor device 100' may include transistors having a multi bridge channel FET (MBCFET™) structure including the channel layers 55, the source/drain regions S/D, and the gate structure GS.

The plurality of channel layers 55 may include two or more channel layers 55 disposed on the active regions ACT1 and ACT2, and spaced apart from each other in a direction perpendicular to an upper surface of the active fin 105, e.g., in a third direction (the Z direction). The plurality of channel layers 55 may be connected to the source/drain regions S/D and may be spaced apart from upper surfaces of the active fins 105. The channel layers 55 may have a width the same or similar to that of the active fin 105 in the second direction (Y-axis direction) and may have a width the same or similar to that of the gate structure GS in the first direction (X-axis direction). However, in some embodiments, the channel layers 55 may have a reduced width so that side surfaces thereof are positioned below the gate structure GS in the first direction (X-axis direction).

The plurality of channel layers 55 may be formed of a semiconductor material, e.g., at least one of silicon (Si), silicon germanium (SiGe), and germanium (Ge). The plurality of channel layers 55 may be formed of, e.g., the same material as the semiconductor substrate 101. The number and shape of the channel layers 55 may vary in embodiments.

The gate structure GS may be disposed on the active fins 105 and the plurality of channel layers 55, and may extend to cross the active fins 105 and the plurality of channel layers 55. Channel regions of transistors may be formed in the active fins 105 and the plurality of channel layers 55 crossing the gate structure GS. In this embodiment, the gate insulating layer 42 may be disposed not only between the active fin 105 and the gate electrode layer 45, but also between the plurality of channel layers 55 and the gate electrode layer 45. The gate electrode layer 45 may be disposed to fill portions between the plurality of channel layers 55 on the active fins 105 and extend upwardly of the plurality of channel layers 55. The gate electrode layer 45 may be spaced apart from the plurality of channel layers 55 by the gate insulating layer 42.

The internal spacer layers 58 may be disposed in parallel with the gate electrode layer 45 between the plurality of channel layers 55. The gate electrode layer 45 may be spaced apart and electrically separated from the source/drain regions S/D by the internal spacer layers 58. A side surface of the internal spacer layers 58 may be flat or may be rounded to be inwardly convex toward the gate electrode layer 45. The internal spacer layers 58 may be formed of, e.g., oxide, nitride, or oxynitride, and in particular, a low-k film.

Figure 3:
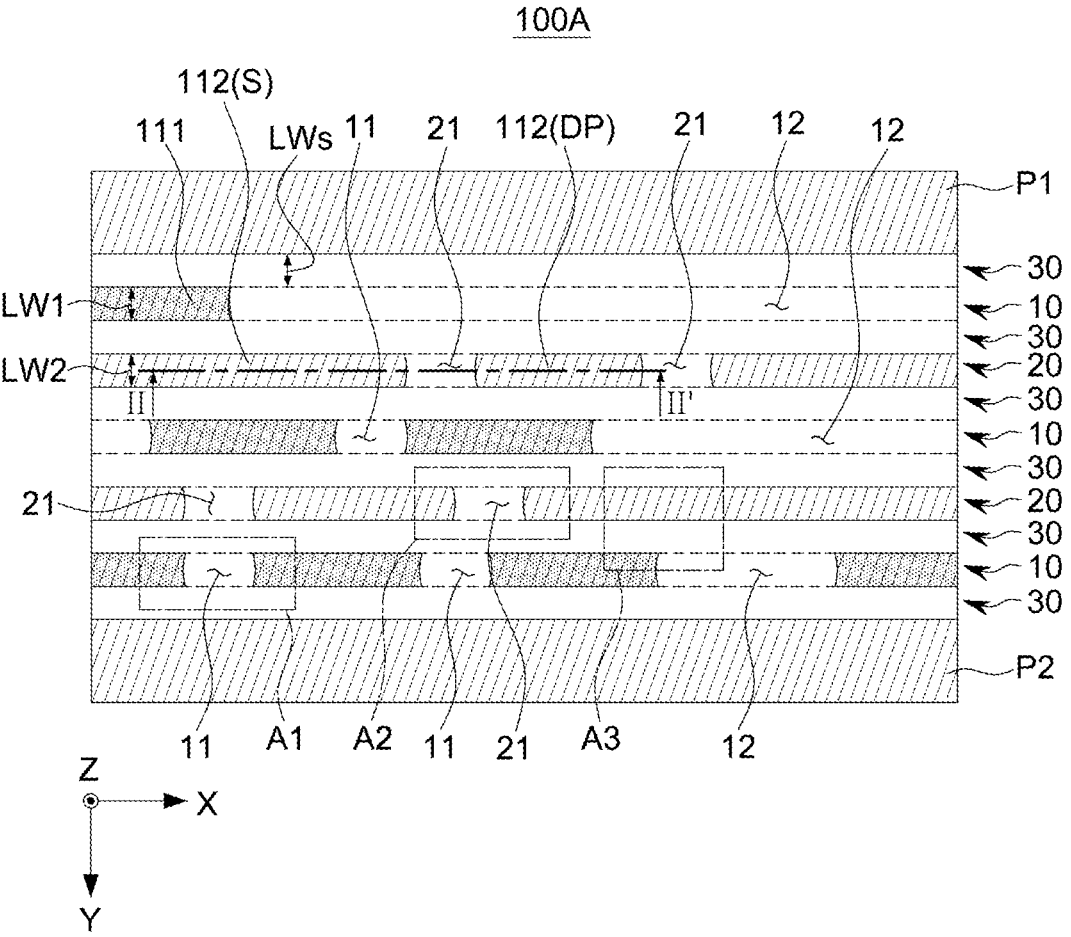
FIG. 3 is a plan view of a semiconductor device according to an embodiment.
Figure 4A:
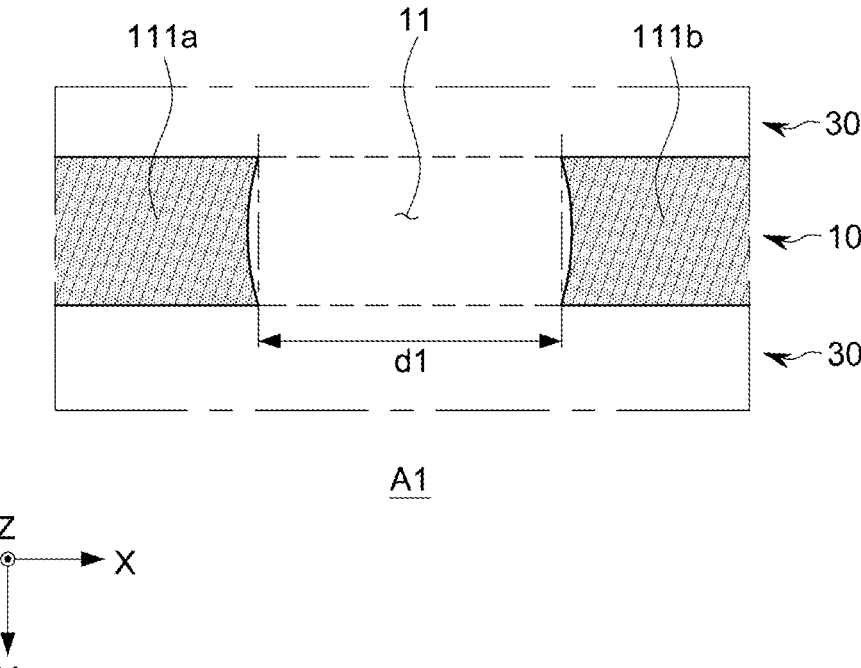
FIGS. 4A to 4C are partially enlarged views of regions 'A1', 'A2', and 'A3' of FIG. 3, respectively.
Figure 4B:
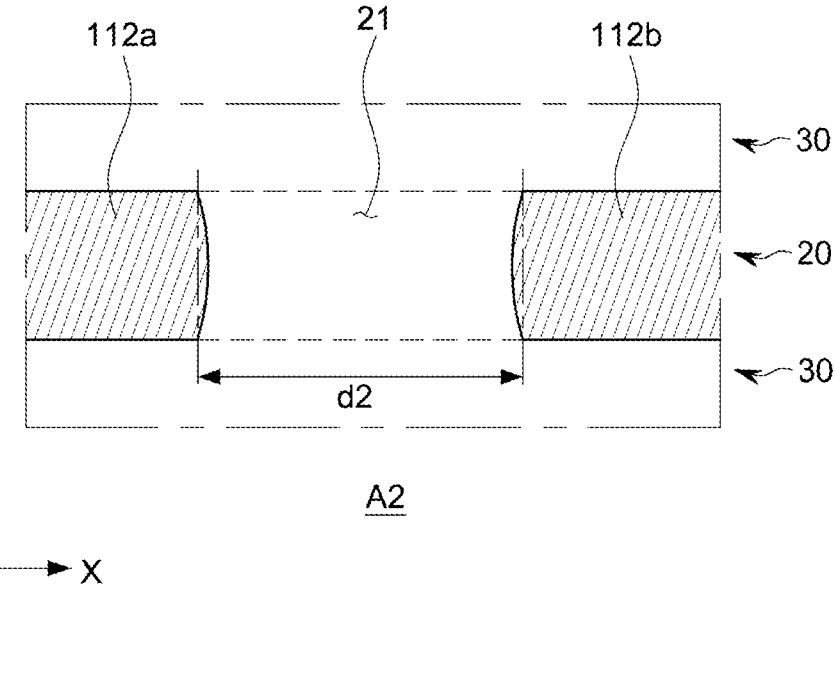
Figure 4C:
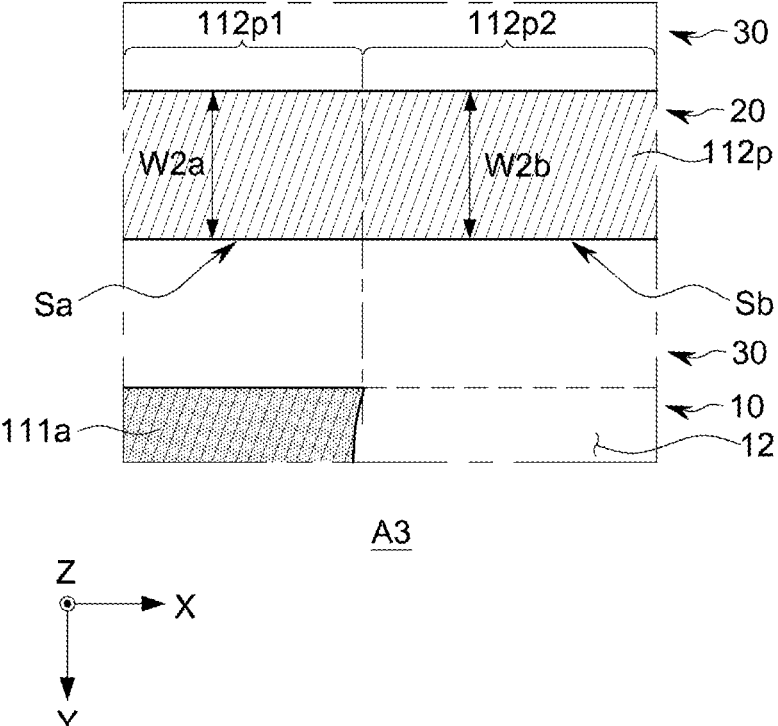
Figure 4D:
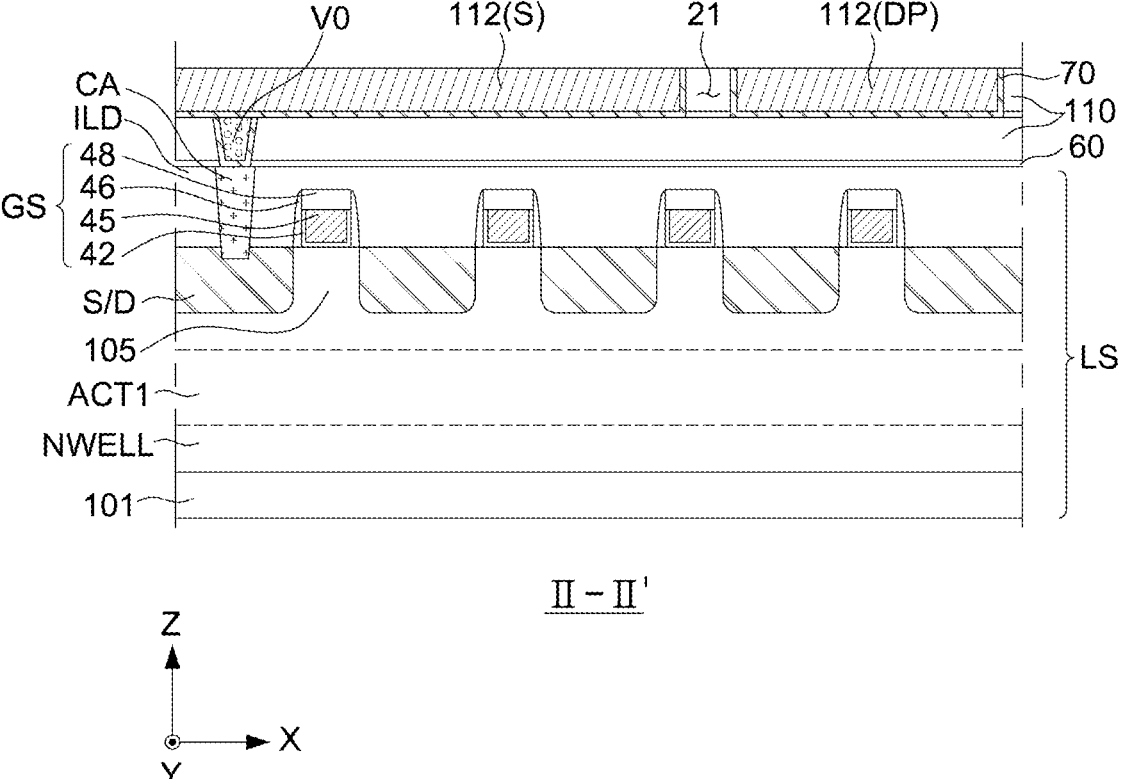
FIG. 4D is a cross-sectional view along line II-II' of FIG. 3.

FIG. 3 is a plan view illustrating the semiconductor device 100A of FIG. 1, FIGS. 4A to 4C are partially enlarged views of regions 'A1', 'A2', and 'A3' of FIG. 3, respectively, and FIG. 4D is a cross-sectional view along line II-II' of FIG. 3.

Referring to FIGS. 3 to 4D, the semiconductor device 100A according to an embodiment may include the pair of power interconnections P1 and P2, a plurality of first pattern regions 10, a plurality of second pattern regions 20, and a plurality of spacer regions 30.

The pair of power interconnections P1 and P2 may be power rails extending in the first direction (X-axis direction) and spaced apart from each other in the second direction (Y-axis direction). The pair of power interconnections P1 and P2 may define upper and lower outlines of a standard cell. For example, when the pair of power interconnections P1 and P2 is an outline defining a standard cell, a plurality of different or identical standard cells may be arranged in the first direction (X-axis direction) along the outline between the pair of power interconnections P1 and P2. The pair of power interconnections P1 and P2 may be power lines supplying different potentials to standard cells disposed therearound. For example, the first power interconnection P1 may supply a first power source VDD, and the second power interconnection P2 may supply a second power source VSS smaller than the first power source VDD. The pair of power interconnections P1 and P2 may include a conductive material, e.g., at least one of aluminum (Al), copper (Cu), and tungsten (W).

The plurality of first and second pattern regions 10 and 20 may extend in the first direction (X-axis direction) and may be alternately disposed in the second direction (Y-axis direction) between the pair of power interconnections P1 and P2. In addition, the plurality of first and second pattern regions 10 and 20 may include a plurality of first and second patterns 111 and 112 separated in the first direction (X-axis direction) by the blocking gaps 11 and 21, respectively. Shapes of ends of the plurality of first and second patterns 111 and 112 adjacent to the first and second blocking gaps 11 and 21 and the blocking region 12 may be different from each other. For example, both ends of, e.g., each of, the plurality of first patterns 111 may be concave in the first direction (X-axis direction), e.g., curved inwardly with respect to each of the first patterns 111, and both ends of, e.g., each of, the plurality of second patterns 112 may be convex in the first direction (X-axis direction), e.g., curved outwardly with respect to each of the second patterns 112. The plurality of first and second patterns 111 and 112 may have substantially the same first and second line widths LW1 and LW2, e.g., in the second direction (Y-axis direction), but are not limited thereto. The first and second line widths LW1 and LW2 may have different values depending on the design.

Figure 9F:
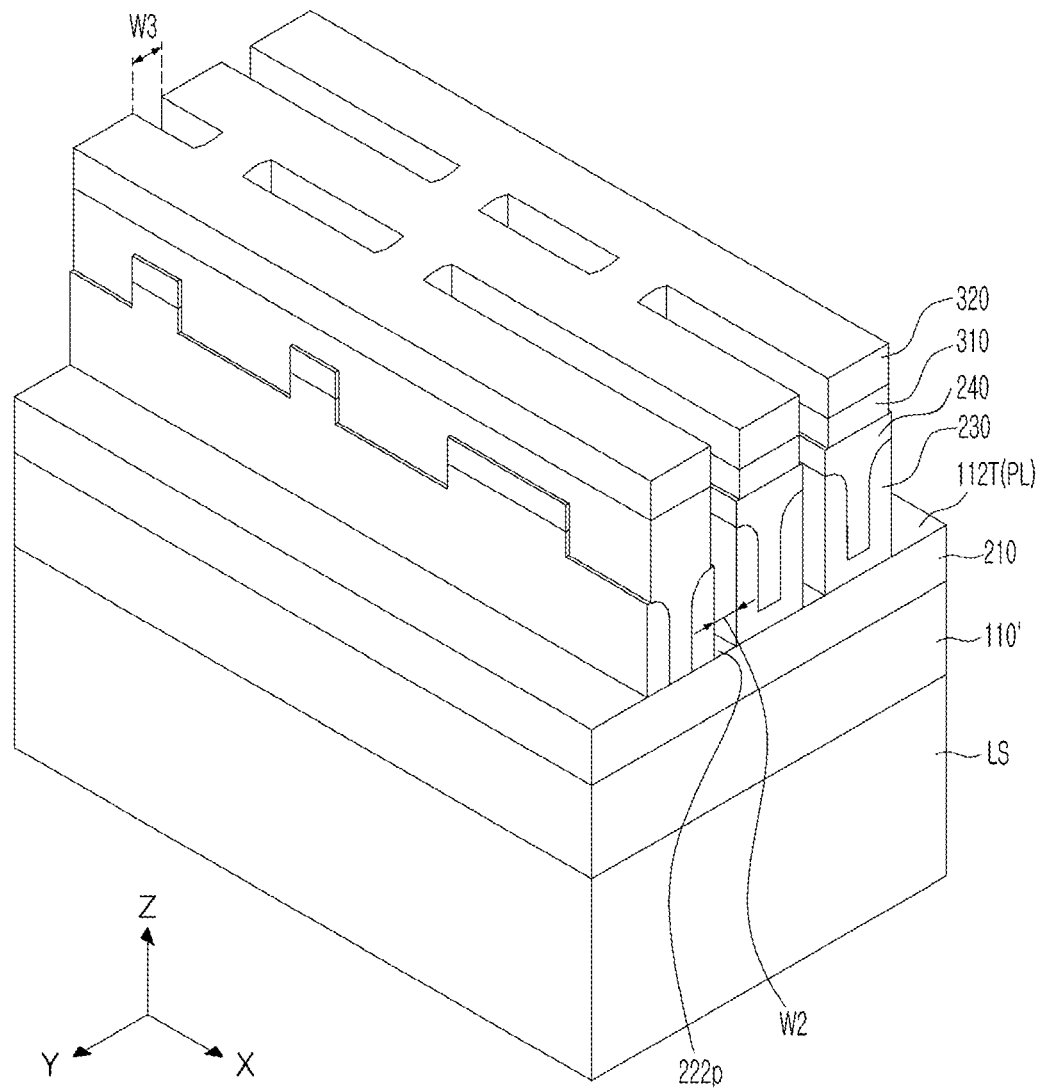
Figure 9G:
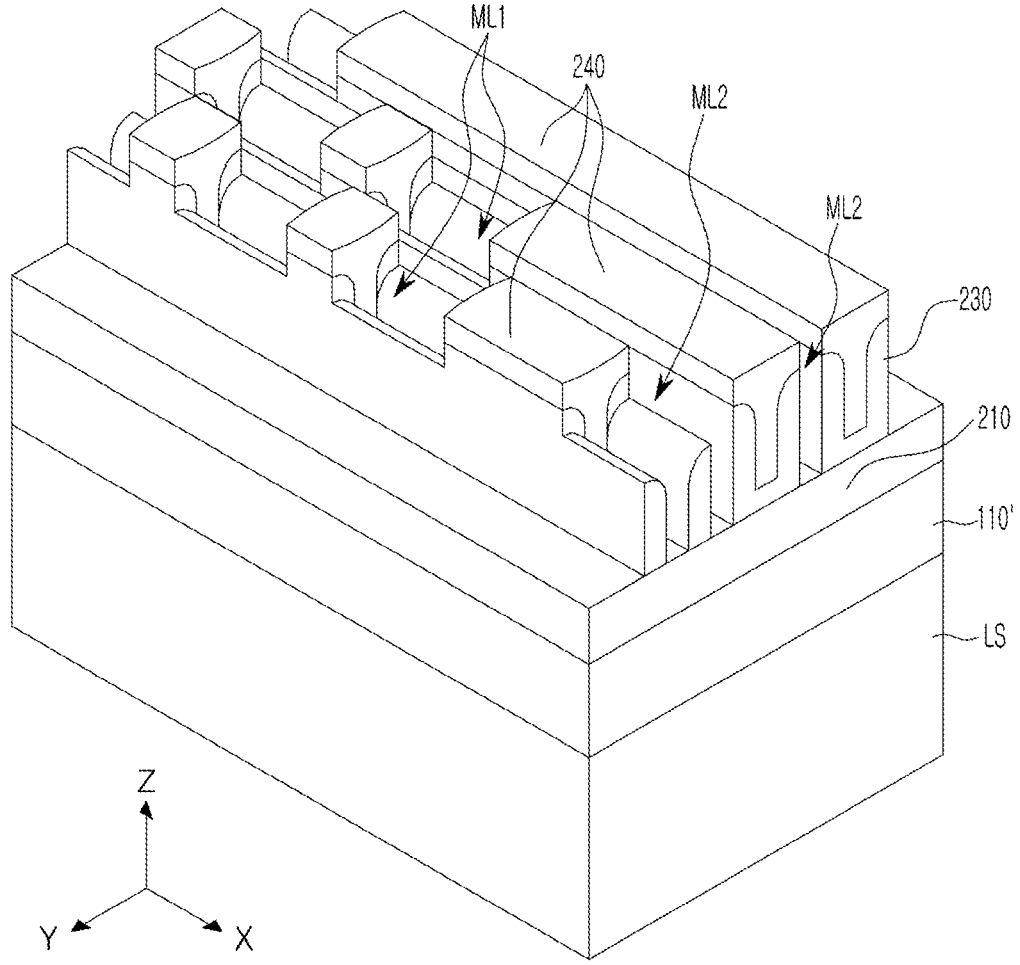

Embodiments may improve a process margin by uniformly establishing a process environment during a photolithography and etching process (see FIGS. 9A and 9E) and prevent a degradation of performance of the semiconductor device by removing some dummy patterns during the manufacturing process (see FIGS. 9D and 9G). Accordingly, the blocking region 12 providing a spacing distance greater than that of the first blocking gap 11, e.g., in the first direction (X-axis direction), may be positioned at one end of at least some of the plurality of first patterns 111. Here, the blocking region 12 may be a region from which a dummy pattern is removed. Also, the plurality of second patterns 112 may be separated by the second blocking gap 21 and densely disposed in the first direction (X-axis direction). Here, the plurality of second patterns 112 may include at least one dummy pattern DP. As described above, the arrangement of the plurality of densely disposed second patterns 112 may be understood as a result of uniformly establishing an environment for photolithography and etching processes. Accordingly, as described above with reference to FIG. 1, according to embodiments, the first and second patterns 111 and 112 in the plurality of first and second pattern regions 10 and 20 may be formed to have different pattern densities. For example, in the region between the pair of power interconnections P1 and P2, the pattern density of the plurality of first patterns 111 may be less than the pattern density of the plurality of second patterns 112. Alternatively, the pattern density of the plurality of first patterns 111 in the plurality of first pattern regions 10 may be less than the pattern density of the plurality of second patterns 112 in the plurality of second pattern regions 20.

For example, as illustrated in FIGS. 4A and 4B, at least some of the plurality of first pattern regions 10 may include a plurality of first patterns 111a and 111b overlapping, e.g., collinear, in the first direction (X-axis direction) and separated at a first interval d1 by the first blocking gap 11, e.g., in the first direction (X-axis direction). Similarly, at least some of the plurality of second pattern regions 20 may include a plurality of second patterns 112a and 112b overlapping, e.g., collinear, in the first direction (X-axis direction) and separated at a second interval d2 by the second blocking gap 21, e.g., in the first direction (X-axis direction). Here, the first interval d1 and the second interval d2 may be substantially equal. "Being substantially equal" may not mean physically equal intervals, but may refer to that they are designed at equal intervals. For example, the first interval d1 and the second interval d2 may be understood as critical spacing distances based on a design rule of a standard cell. The critical spacing distance may refer to a minimum distance at which patterns formed in a semiconductor device are physically separated by patterning a layout of a standard cell.

In addition, as a result of uniformly establishing a process environment during the photolithography and etching process, side surfaces of the second patterns 112 adjacent to the blocking region 12, among the plurality of second patterns 112 formed later in the manufacturing process, may be formed to be flat.

For example, as illustrated in FIG. 4C, a second pattern 112p adjacent to the first pattern 111a may have a first portion 112p1 overlapping the first pattern 111a in the second direction (Y-axis direction) and a second portion 112p2 overlapping the blocking region 12 (i.e., not overlapping the first pattern 111a), and side surfaces sa and sb of the respective first and second portions 112p1 and 112p2 adjacent to, e.g., and facing, the first pattern 111a may be substantially coplanar with each other. In this case, since the second portion 112p2 corresponds to the blocking region 12, the second portion 112p2 may have a length greater than the interval of the blocking gaps 11 and 21.

If a full track process (as illustrated in FIGS. 9A to 9D) is not performed in the process of forming the plurality of first and second patterns 111 and 112, e.g., if patterns are formed collinearly at a varying pitch rather than continuously with a dummy pattern to be removed later for density adjustment, only one end of the first pattern adjacent to the blocking region 12 may be convex (rather than both), and since a pattern block layer (see "240" of FIG. 9D) corresponding to the blocking region 12 is not formed during the manufacturing process, one side surface of the second pattern may extend to a portion in which the pattern block layer (see "240" of FIG. 9D) is not formed, so that at least some of the plurality of second patterns 112 may have a relatively large line width. In contrast, according to embodiments, the patterning layers ('220' and '320' in FIGS. 9A and 9E) are patterned by a full track process, regardless of positions of the patterns to be actually formed (e.g., the first and second patterns 111 and 112) and a dummy pattern is removed using the pattern block layer (240 of FIG. 9D). Thus, the plurality of second patterns 112 may all have substantially the same line width. Here, the dummy pattern refers to a pattern electrically insulated from the source/drain regions and the gate structure of the lower structure LS illustrated in FIGS. 1 to 2C.

For example, as illustrated in FIG. 4D, the lower structure LS including the semiconductor substrate 101, the active regions ACT1 and ACT2, the source/drain regions S/D, and the gate structure GS may be disposed below the plurality of second patterns 112. The plurality of second patterns 112 may include a signal pattern S connected to the source/drain regions S/D or the gate structure GS, and the dummy pattern DP electrically insulated from the source/drain regions S/D and the gate structure GS. The dummy pattern DP may be physically and electrically separated from the signal pattern S by the second blocking gap 21. Here, the "signal pattern S" is used as a term to refer to patterns disposed between the pair of power interconnections P1 and P2, e.g., a pattern between the pair of power interconnections P1 and P2 that is electrically connected to the source/drain regions S/D or the gate structure GS, and the "dummy pattern DP" is used as a term to refer to a pattern insulated from the source/drain regions S/D and the gate structure GS, e.g., is not electrically connected to the source/drain regions S/D or the gate structure GS, as compared with the signal pattern S. That is, the "signal pattern S" and the "dummy pattern DP" do not limit the functions of the first and second patterns 111 and 112.

Referring back to FIG. 3, the plurality of spacer regions 30 may be disposed between the pair of power interconnections P1 and P2 and the plurality of first and second pattern regions 10 and 20, and may correspond to an arrangement region of the spacer layer (230 of FIG. 9G) self-aligning the plurality of second patterns 112. The plurality of spacer regions 30 may have substantially the same line width LWs, e.g., in the second direction (the Y-axis direction). Depending on the design, the width LWs of the plurality of spacer regions 30 may be equal to or smaller than the widths LW1 and LW2 of the plurality of first and second pattern regions 10 and 20, but embodiments are not limited thereto. In the drawings, the dotted lines dividing the plurality of first and second pattern regions 10 and 20 and the plurality of spacer regions 30 may be understood as imaginary lines for convenience of description.

Figure 5:
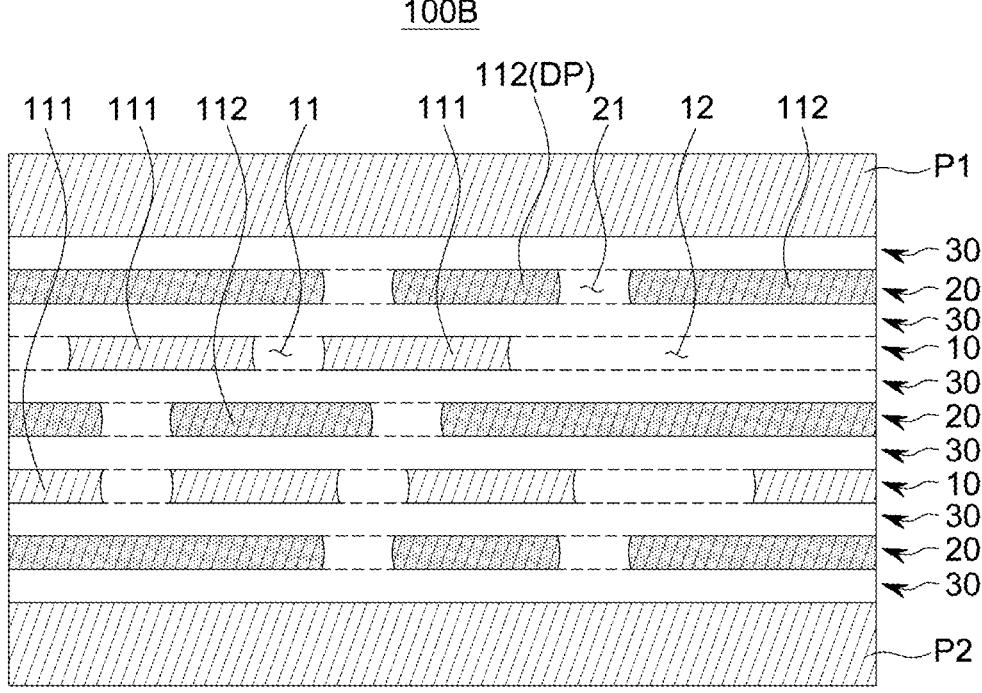
FIG. 5 is a plan view of a semiconductor device according to an embodiment.
Figure 5:
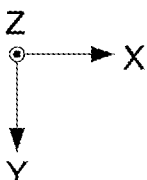

FIG. 5 is a plan view illustrating a semiconductor device 100B according to an embodiment.

Referring to FIG. 5, the semiconductor device 100B according to an embodiment may have the same or similar characteristics to those of the semiconductor device 100A of FIGS. 1 and 3, except that the arrangement order of the plurality of first and second pattern regions 10 and 20 is changed, e.g., the order of the first and second pattern regions 10 and 20 along the second direction (e.g., the Y-axis direction) may be changed. For example, the pair of power interconnections P1 and P2 and the plurality of first patterns 111 may be spaced apart from each other at a same distance in the second direction (Y-axis direction), and the plurality of second patterns 112 may be disposed between the pair of power interconnections P1 and P2 and the plurality of first patterns 111. That is, both the pair of power interconnections P1 and P2 may be disposed adjacent to the plurality of second patterns 112, e.g., a plurality of second patterns 112 may be arranged between the power interconnection P1 and the plurality of first patterns 111. This arrangement relationship may be understood to result from a process in which the pair of power interconnections P1 and P2 is formed in the same patterning operation as that of the plurality of first patterns 111. As a similar concept, in the semiconductor device 100A illustrated in FIG. 3, the pair of power interconnections P1 and P2 may be understood to be formed in the same operation as that of the plurality of second patterns 112.

Figure 6:
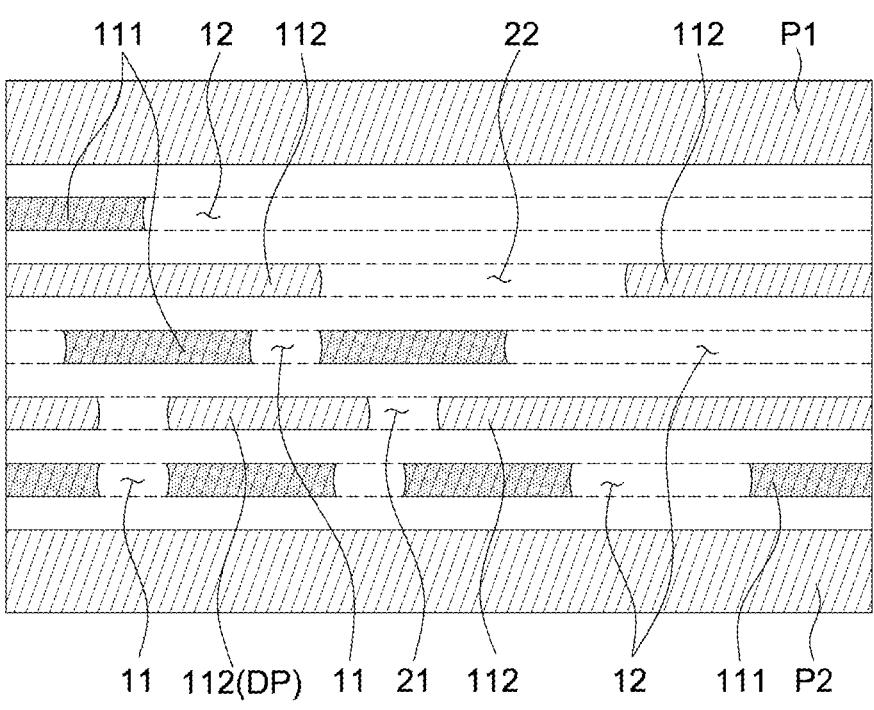
FIG. 6 is a plan view of a semiconductor device according to an embodiment.
Figure 6:
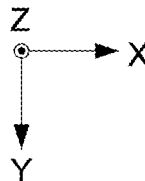

FIG. 6 is a plan view illustrating a semiconductor device 100C according to an embodiment.

Referring to FIG. 6, the semiconductor device 100C according to an embodiment may have the same or similar characteristics to those of the semiconductor device 100A of FIGS. 1 and 3, except that portions of the dummy patterns DP included in the plurality of second patterns 112 are removed. According to the present embodiment, by removing the dummy pattern included in the plurality of second pattern regions 20, the pattern density may be further lowered and a degradation of performance of the semiconductor device 100C may be minimized. For example, at least some of the plurality of second pattern regions 20 may include the second blocking region 22 providing a spacing distance greater than that of the second blocking gap 21.

In an embodiment, ends of the second patterns 112 adjacent to the second blocking region 22 may be convex. However, according to an embodiment, ends of the second patterns 112 may be concave similarly to that of the first patterns 111 adjacent to the first blocking region 12 (refer to the embodiment of FIG. 6).

Also, according to an embodiment, not all of the dummy patterns DP included in the plurality of second patterns 112 may be removed. Some of the second pattern regions 20 formed by the full track process (refer to FIG. 9E) may still include the dummy pattern DP. That is, portions of the dummy patterns included in the plurality of second pattern regions 20 may be selectively removed in consideration of both the effect of securing a process margin using the full track process and the effect of preventing degradation of performance by removing the dummy pattern.

FIG. 7 is a plan view illustrating a semiconductor device 100D according to an embodiment.

Referring to FIG. 7, the semiconductor device 100D according to an embodiment may have the same or similar characteristics to those of the semiconductor device 100C of FIG. 6, except that ends of the second patterns 112 adjacent to the blocking region 22 have a shape different from that of the ends of the second patterns 112 adjacent to the second blocking gap 21. According to the present embodiment, by removing the dummy pattern included in the plurality of second pattern regions 20, the pattern density may be further reduced and a degradation of performance of the semiconductor device 100D may be minimized. In addition, the plurality of second patterns 112 without the dummy pattern may also be formed by a full track process (refer to FIGS. 10A to 10C) to secure margins for the photolithography process and the etching process. In this case, ends of the second patterns 112 adjacent to the second blocking region 22 have a concave shape (refer to region 'B1'), while ends of the second patterns 112 adjacent to the second blocking gap 21 may have a convex shape (refer to area 'B2'). A manufacturing process of the present embodiment will be described later with reference to FIGS. 10A to 10C.

Figure 8A:
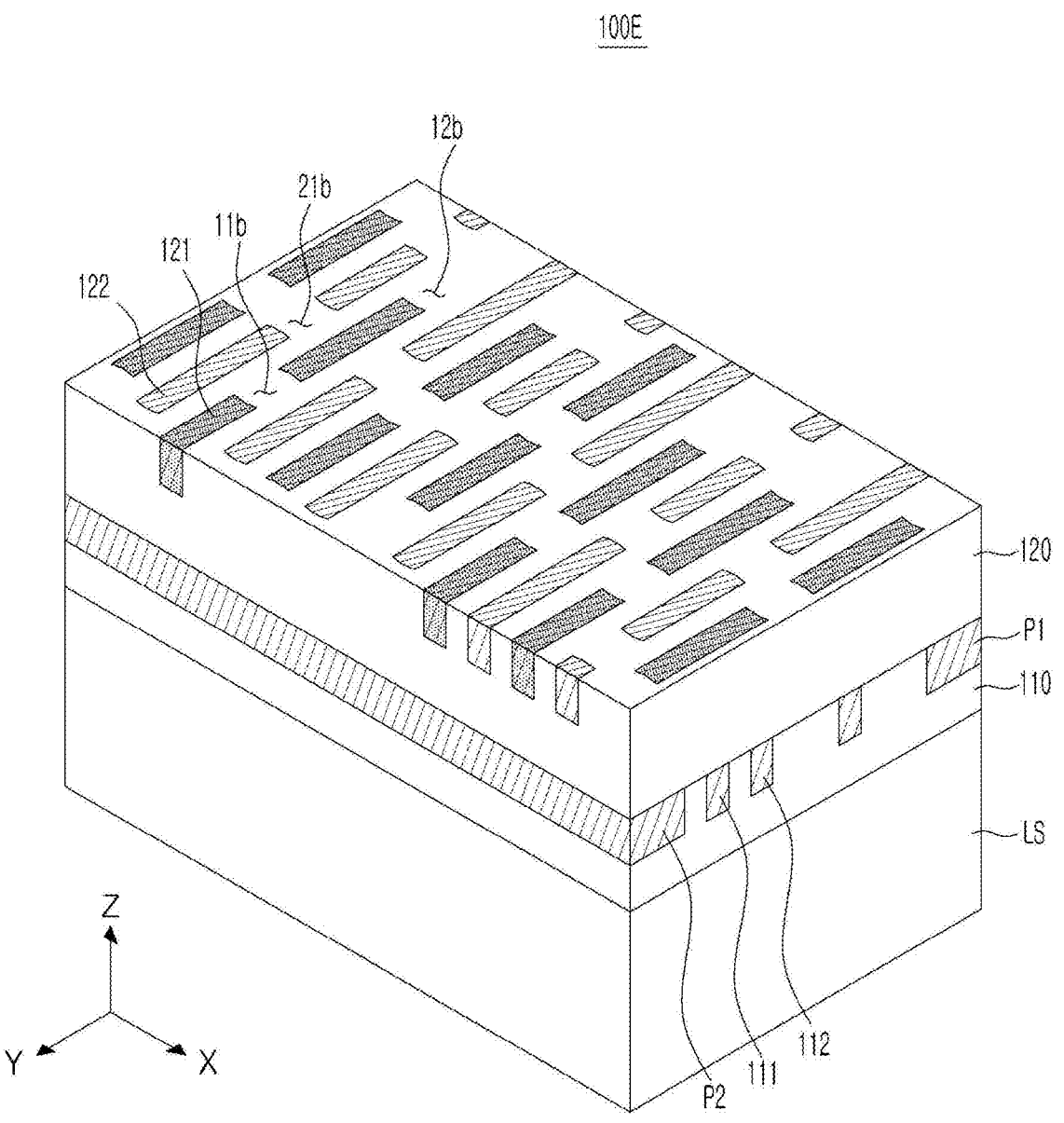
FIGS. 8A and 8B are a perspective view and a plan view, respectively, of a semiconductor device according to an embodiment.
Figure 8B:
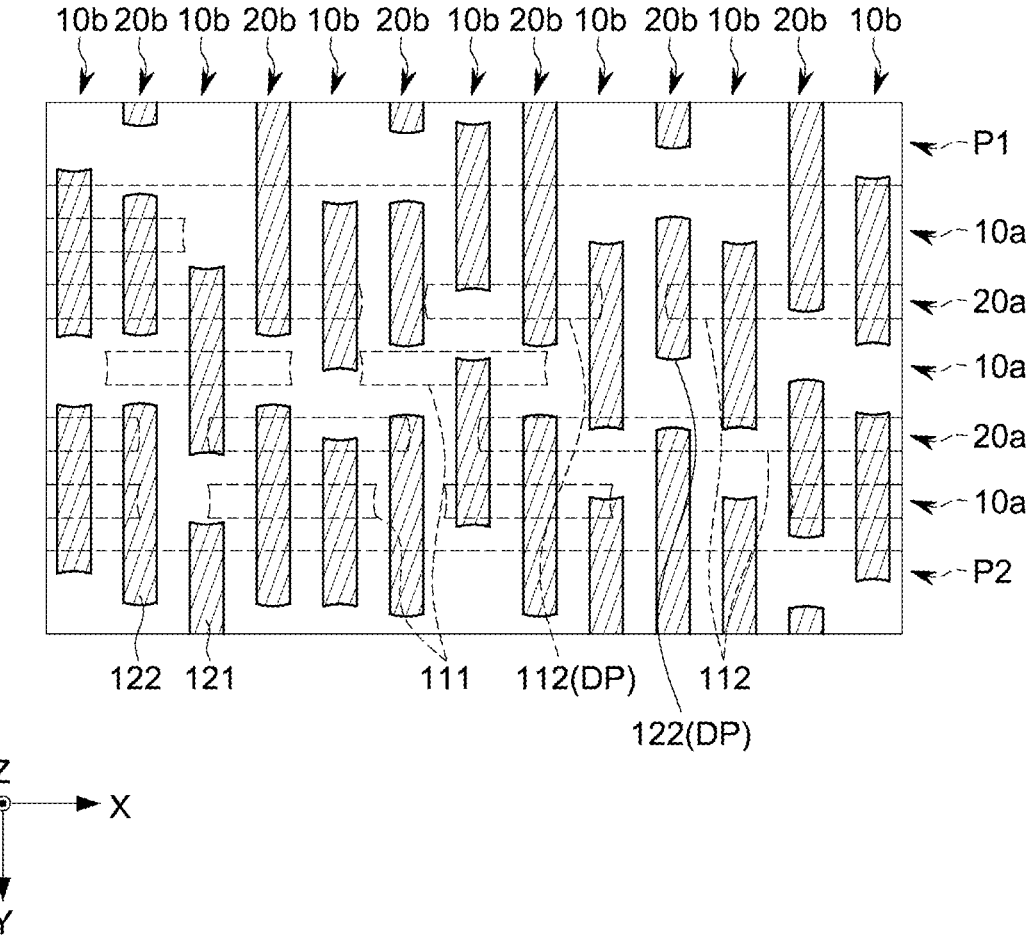

FIGS. 8A and 8B are perspective and plan views illustrating a semiconductor device 100E according to an embodiment.

Referring to FIGS. 8A and 8B, the semiconductor device 100E according to an embodiment may further include a second ILD 120 disposed on the first ILD 110, and a plurality of third and fourth pattern regions 10b and 20b alternately disposed and spaced apart from each other in the second ILD 120 and including at least one of the third and fourth patterns 121 and 122, respectively. The plurality of third and fourth pattern regions 10b and 20b may extend in a direction crossing the plurality of first and second pattern regions 10a and 20a. For example, the plurality of third and fourth pattern regions 10b and 20b may extend in the second direction (Y-axis direction), perpendicular to the plurality of first and second pattern regions 10a and 20a. In addition, the plurality of third and fourth pattern regions 10b and 20b may include third and fourth blocking gaps 11b and 21b and a third blocking region 12b. The plurality of third and fourth patterns 121 and 122 may have different shapes similar to those of the first and second patterns 111 and 112. For example, both ends of the third pattern 121 may be concave similarly to the first pattern 111, and both ends of the fourth pattern 122 may be convex. In this case, at least one of the plurality of fourth patterns 122 may be a dummy pattern DP electrically insulated from the first and second patterns 111 and 112. In addition, the dummy pattern DP among the plurality of second patterns 112 may also be electrically insulated from the third and fourth patterns 121 and 122. Although not distinguished in the drawing, spacer regions (refer to '30' in FIG. 3) may be disposed between the plurality of third and fourth pattern regions 10b and 20b. The second ILD 120 and the third and fourth patterns 121 and 122 may be formed by repeating the process of manufacturing the first and second patterns 111 and 112 described later with reference to FIGS. 9A to 9I in a similar manner.

In addition, in the present embodiment, the patterns in the first and second ILDs 110 and 120 have been described as including features according to embodiments. However, features according to embodiments may be selectively included only in patterns in the first or second ILDs 110 and 120. In addition, an ILD and upper patterns may be further disposed on the second ILD 120, and the upper patterns may also be formed to include features according to embodiments.

FIGS. 9A to 9I are perspective views illustrating stages in a process of manufacturing a semiconductor device according to an embodiment. FIGS. 9A to 9I schematically illustrate a manufacturing process of the semiconductor device 100A illustrated in FIGS. 1 and 3.

Referring to FIG. 9A, first, a dielectric layer 110', a first hard mask 210, and a first patterning layer 220 may be sequentially formed on the lower structure LS.

The lower structure LS may be a semiconductor substrate on which a plurality of semiconductor devices, contact structures, etc. are formed as described above with reference to FIGS. 1 to 2C. The dielectric layer 110' may include, e.g., silicon oxide, silicon nitride, or a low-k insulating material. The dielectric layer 110' may be understood as an element corresponding to the first ILD 110 described above. The dielectric layer 110' may be formed by a deposition process. For example, the dielectric layer 110' may be a silicon oxide film formed by a CVD process. The dielectric layer 110' may be formed as a single film or as a multilayer film in which a plurality of films are stacked.

The first hard mask 210 may include a material having etch selectivity with respect to the dielectric layer 110' during the process of etching the first hard mask 210 (refer to FIG. 9G). Also, the first hard mask 210 may be formed as a single layer or as a multilayer in which a plurality of materials are stacked. For example, the first hard mask 210 may be a single-layer or multilayer mask including silicon oxide, silicon nitride, silicon oxynitride, boron nitride, metal, metal nitride, metal oxide, silicon oxide, silicon nitride, titanium nitride, boron nitride, amorphous carbon, metal, and/or metal oxide. The first hard mask 210 may be formed through a deposition process, e.g., physical vapor deposition (PVD), chemical vapor deposition (CVD), atomic layer deposition (ALD), electrochemical deposition (ECD), spin coating, or the like.

The first patterning layer 220 may be deposited on the first hard mask 210. The first patterning layer 220 may include a photosensitive material, e.g., a photoresist. According to an embodiment, the first patterning layer 220 may include, e.g., amorphous silicon. When the first patterning layer 220 does not include a photosensitive material, a photoresist layer may be additionally formed on the first patterning layer 220.

Next, the first patterning layer 220 may be patterned to form a non-mandrel region 221 extending continuously in the first direction (X-axis direction) and a mandrel pattern 222 defined by the non-mandrel region 221. The first patterning layer 220 may be patterned by performing a photolithography process, a developing process, and an etching process. The first patterning layer 220 may be patterned so that a line width $W1a$ of the non-mandrel region 221 in the second direction (Y-axis direction) is greater than a line width $W2$ of the mandrel pattern 222. In an example, a mandrel pattern PL corresponding to the power interconnection ('P1' and 'P2' in FIG. 3) may have a line width WP2 greater than the line width $W2$ of other mandrel patterns 222.

Referring to FIG. 9B, a preliminary spacer layer 230P may be formed on the non-mandrel region 221 and the mandrel pattern 222. The preliminary spacer layer 230P may extend along a surface of the mandrel pattern 222 and cover upper and side surfaces of the mandrel pattern 222 and an upper surface of the non-mandrel region 221 exposed from the mandrel pattern 222. The preliminary spacer layer 230P may be formed conformally using a deposition process, e.g., an ALD process. The preliminary spacer layer 230P may include a material having etch selectivity with respect to the mandrel pattern 222 and the first hard mask 210. For example, the preliminary spacer layer 230P may include silicon oxide, silicon nitride, titanium nitride, boron nitride, amorphous carbon, metal, and/or metal oxide.

Referring to FIG. 9C, a pattern block layer 240 dividing the non-mandrel region 221 into a plurality of first pattern lines ML1 may be formed on the preliminary spacer layer 230P covering the non-mandrel region 221. The pattern block layer 240 may be formed to cut the non-mandrel region 221 in an actual pattern form (e.g., a plurality of first patterns ('111' in FIG. 3) separated by the blocking gap ('11' of FIG. 3) or the blocking region ('12' of FIG. 3). For example, the pattern block layer 240 may be formed to overlap at least a portion of the preliminary spacer layer 230P in a vertical direction (the Z-axis direction), but may not overlap the mandrel pattern 222, e.g., in the Z-axis direction. For example, in a plan view, the pattern block layer 240 may extend in the first direction (X-axis direction) on the non-mandrel region 221 and the preliminary spacer layer 230P but may not overlap, e.g., tops of, the adjacent mandrel patterns 222. In another example, according to another embodiment, the pattern block layer 240 may be formed to overlap a portion of the mandrel pattern 222 (as will be described with reference to FIG. 10A below). The pattern block layer 240 may be formed by depositing a material having etch selectivity with respect to the mandrel pattern 222 and the first hard mask 210 in an opening formed by patterning a photoresist layer (not illustrated).

The pattern block layer 240 may be formed as a plurality of pattern block layers including a pattern block layer BG corresponding to the blocking gap ('11' in FIG. 3) and a pattern block layer BA corresponding to the blocking region ('12' in FIG. 3). According to embodiments, the pattern block layer BA is formed in an unnecessary region (a region in which a dummy pattern is to be formed) in the non-mandrel region 221 formed by a full track process to reduce a pattern density of the first patterns to be formed later and minimize a degradation of performance due to an increase in capacitance between adjacent patterns. In addition, both ends of the pattern block layer 240 may be convex in the first direction (X-axis direction) by a forming process using a photoresist layer. For example, in a plan view, both ends of the pattern block layer BG corresponding to the blocking gap ('11' in FIG. 3) and the pattern block layer BA corresponding to the blocking region ('12' in FIG. 3) may be convex. Accordingly, both ends of the plurality of first patterns ('111' in FIG. 3) formed to be cut by the pattern block layer 240 may be concave.

Referring to FIG. 9D, a portion of the preliminary spacer layer ('230P' in FIG. 9C) exposed from the pattern block layer 240 may be etched to form the spacer layer 230 extending along a sidewall of the mandrel pattern 222. The preliminary spacer layer ('230P' in FIG. 9C) may be removed in the vertical direction (the Z-axis direction) using, e.g., an anisotropic reactive ion etching (RIE) process. Through this, a plurality of spacer layers 230 may be formed on the first hard mask 210. In this case, the two spacer layers 230 may be formed on both sidewalls of one mandrel pattern 222. Accordingly, the non-mandrel region 221 may be formed on the sidewalls of different mandrel patterns 222 and exposed between two spacer layers 230 adjacent to each other. That is, a line width W1$b$ of the non-mandrel region 221 may be defined by two adjacent spacer layers 230, which may correspond to a line width ('LW1' in FIG. 3) of the first pattern region 10 of FIG. 3 or a line width of the first pattern ('111' in FIG. 3). In addition, the spacer layer 230 may include a first spacer layer 230$a$ exposed by the pattern block layer 240 and a second spacer layer 230$b$ covered by the pattern block layer 240. Since the second spacer layer 230$b$ is covered by the pattern block layer 240, the second spacer layer 230$b$ may not be etched during the etching process of the preliminary spacer layer ('230P' in FIG. 9C). Accordingly, the second spacer layer 230$b$ may protrude more than the first spacer layer 230$a$ in the vertical direction (the Z-axis direction). However, in some embodiments, the etching process of the preliminary spacer layer ('230P' in FIG. 9C) may be performed before the pattern block layer 240 is formed.

As such, in embodiments, since the non-mandrel region 221 defining the first pattern region 10 of FIG. 3 is formed by the full track process, irrespective of an actual pattern shape (e.g., a plurality of first patterns ('111' of FIG. 3) separated by the blocking gap 11 or the blocking region 12), a process environment such as the photolithography process and the etching process described above with reference to FIGS. 9A to 9D may be uniformly established. When various process environments have to be satisfied in the photolithography process and the etching process for forming a fine pattern, a process margin may be significantly reduced. Meanwhile, in embodiments, the process margin may be improved during the process of forming a fine pattern by uniformizing the process environment.

Referring to FIG. 9E, the second hard mask 310 covering the mandrel pattern 222, the spacer layer 230, and the pattern block layer 240, and the second patterning layer 320 on the second hard mask 310 may be sequentially formed.

The second hard mask 310 may include the spacer layer 230 and a material having etch selectivity. Also, the second hard mask 310 may be formed as a single layer or as a multilayer in which a plurality of materials are stacked. The second hard mask 310 may be formed of, e.g., a spin on hardmask (SOH) or an amorphous carbon layer (ACL). The second hard mask 310 may be formed to cover the mandrel pattern 222, the spacer layer 230, and the pattern block layer 240 by a spin coating process. However, embodiments are not limited thereto, e.g., the second hard mask 310 may be formed by a deposition process.

The second patterning layer 320 may be deposited on the second hard mask 310. The second patterning layer 320 may include a photosensitive material, e.g., a photoresist. According to an embodiment, the second patterning layer 320 may include, e.g., amorphous silicon. When the second patterning layer 320 does not include a photosensitive material, a photoresist layer may be additionally formed on the second patterning layer 320.

Next, the second patterning layer 320 may be patterned to form a mandrel etched region 321, i.e., a region overlapping the mandrel pattern 222 in the vertical direction (the Z-axis direction) and extending parallel to the mandrel pattern 222, and a mandrel cut pattern 322, i.e., a region dividing the mandrel etched region 321 into a plurality of second pattern lines ML2. For example, referring to FIG. 9E, the mandrel etched region 321 and the mandrel cut pattern 322 may be aligned along the X-axis direction, such that the mandrel cut pattern 322 may separate the second pattern lines ML2 in the mandrel etched region 321 from each other. The second patterning layer 320 may be patterned by performing a photolithography process, a developing process, and an etching process. Here, the mandrel etched regions 321 may be understood as corresponding to the plurality of second pattern regions ('20' of FIG. 3) and the plurality of second pattern lines ML2 may be understood as corresponding to the plurality of second patterns 112 within the second pattern region 20. However, a line width W3 of the mandrel etched region 321 may be wider than the line width ('LW2' of FIG. 3) of the plurality of second pattern regions ('20' in FIG. 3). This will be described later with reference to FIG. 9F.

In an embodiment, at least some of the dummy lines DP among the plurality of second pattern lines ML2 may be lines for forming a dummy pattern. Accordingly, in the patterning process of the second patterning layer 320 and the second hard mask 310, an environment in which a plurality of regularly cut second pattern lines ML2 are concentrated may be established to further improve a process margin for forming a fine pattern. However, according to an embodiment, the dummy line DP may be omitted in a region having a high pattern density. In this case, the second blocking region 22 may be formed as described above in the embodiment of FIG. 6. In an example, a portion of the mandrel etched region 321 may be a region PL corresponding to the power interconnections ('P1' and 'P2' in FIG. 3).

In addition, the mandrel cut pattern 322 may have a concave shape at both ends by a photolithography process and an etching process. For example, in a plan view, the mandrel cut pattern 322 corresponding to the blocking gap ('21' in FIG. 3) may have both ends concave. Accordingly, the plurality of second patterns ('112' in FIG. 3) formed to be cut by the mandrel cut pattern 322 may have both ends convex.

Referring to FIG. 9F, the second hard mask 310 and the mandrel pattern ('222' in FIG. 9E) may be etched using the patterned second patterning layer 320. In this case, the spacer layer 230 and the pattern block layer 240 may not be etched according to etch selectivity. Accordingly, when the line width W3 of the mandrel etched region ('321' in FIG. 9E) formed in the second patterning layer 320 is formed to be wider than the line width W2 of the mandrel pattern ('222' in FIG. 9E), the mandrel etched patterns 222p (corresponding to the plurality of second patterns 112 of FIG. 3) may be self-aligned by the spacer layer 230. After the etching process, the spacer layer 230 and the pattern block layer 240 may partially protrude in the etched region corresponding to the line width W3 of the mandrel etched region ('321' in FIG. 9E).

Referring to FIG. 9G, the second patterning layer 320 and the second hard mask 310 may be removed, and the first hard mask 210 may be patterned using the spacer layer 230 and the pattern block layer 240. The second patterning layer 320 and the second hard mask 310 may be removed by performing an ashing process, a strip process, or the like. The first hard mask 210 may be patterned by performing a directional etching process using the spacer layer 230 and the pattern block layer 240 as etch masks. Accordingly, the first hard mask 210 may be patterned to include a plurality of openings corresponding to the plurality of first and second pattern lines ML1 and ML2. Thereafter, an etching process of the dielectric layer 110' may be performed using the patterned first hard mask 210 as an etch mask.

Figure 9H:
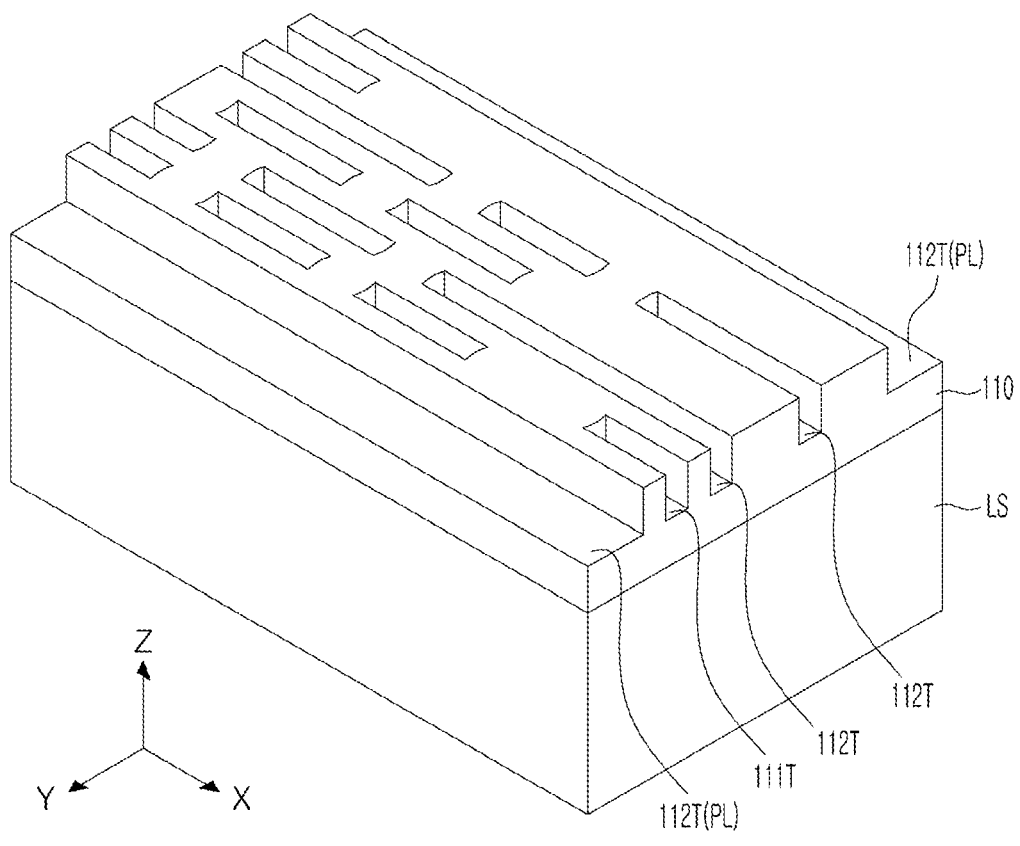

Referring to FIG. 9H, a plurality of first trenches 111T and a plurality of second trenches 112T may be formed on the dielectric layer 110. The plurality of first and second trenches 111T and 112T may be formed to correspond to the plurality of first and second pattern lines ML1 and ML2 of FIG. 9G by a directional etching process. Some of the plurality of second trenches 112T may correspond to the power interconnection PL, and may have a width greater than that of the remaining first and second trenches 111T and 112T.

Figure 9I:
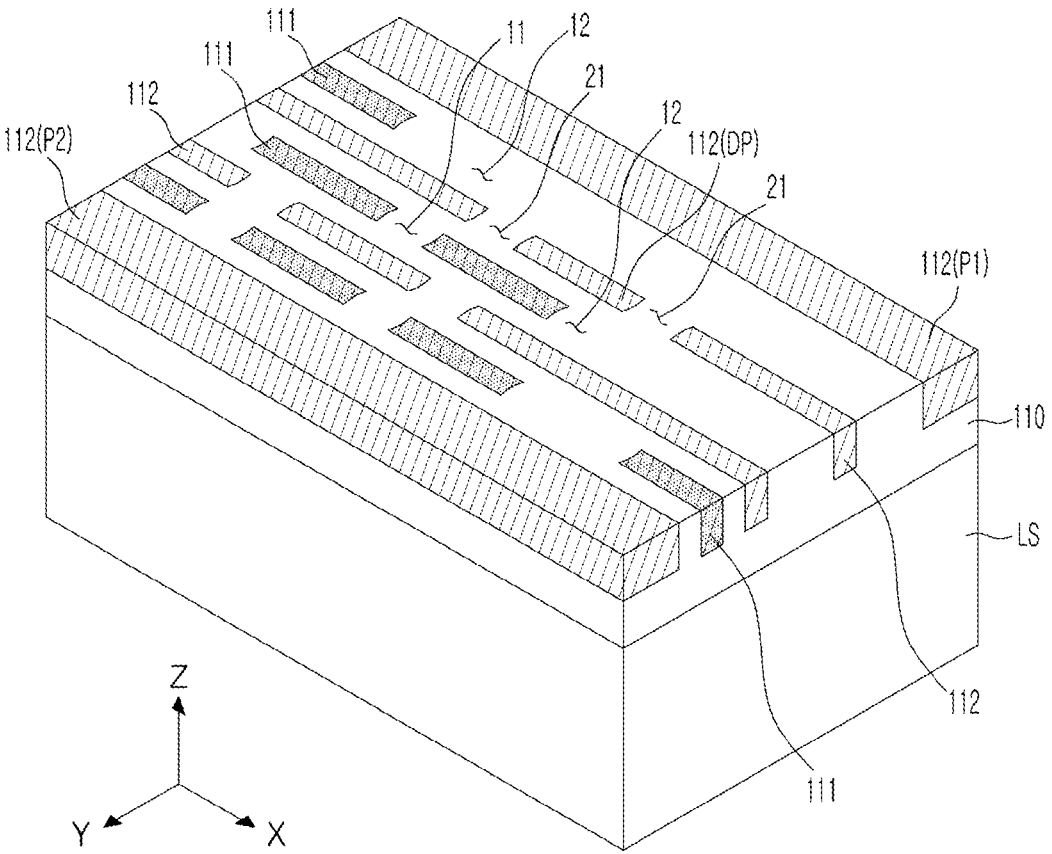

Referring to FIG. 9I, a plurality of the first and second patterns 111 and 112 may be formed by plating a metallic material in the plurality of first and second trenches 111T and 112T. In an example, the plurality of second patterns 112 may include the pair of power interconnections P1 and P2 and at least one dummy pattern DP.

As described above, in embodiments, a full-track process of densely forming etch patterns on a photomask is introduced to minimize variables affecting a process margin in the process of forming a fine pattern of a semiconductor device, and the blocking region 12 (refer to FIGS. 9A to 9D) of removing a partial dummy pattern is introduced to minimize degradation of performance due to an increase in pattern density. Accordingly, the semiconductor device formed by the manufacturing method illustrated in FIGS. 9A to 9I may include a plurality of first patterns 111 extending in the first direction (X-axis direction) that are concave at both ends and plurality of second patterns 112 alternately disposed in the second direction (Y-axis direction) that are convex at both ends. Also, the plurality of first patterns 111 may not include the dummy pattern, while the plurality of second patterns 112 may include at least one dummy pattern DP. Accordingly, the pattern density of the plurality of first patterns 111 in a specific region (e.g., a region defined as a standard cell) may be smaller than the pattern density of the plurality of second patterns 112.

FIGS. 10A to 10C are perspective views illustrating a part of a process of manufacturing the semiconductor device 100D of FIG. 7. FIG. 10A illustrates a manufacturing process corresponding to FIG. 9D, FIG. 10B illustrates a manufacturing process corresponding to FIG. 9E, and FIG. 10C illustrates a manufacturing process corresponding to FIG. 9I.

Referring to FIGS. 10A and 10B, the pattern block layer 240 may be formed to cover at least a portion of the mandrel pattern 222. For example, the pattern block layer 240 may further include a second pattern block layer BA2 for cutting the mandrel pattern 222. The second pattern block layer BA2 may be formed to overlap a mandrel etched region 321DP corresponding to the position of the dummy pattern (refer to 'DP' of FIG. 9E). The second pattern block layer BA2 may be understood as corresponding to the second blocking region ('22' in FIG. 7). In an example, when the mandrel pattern 222 is cut using the pattern block layer 240, the mandrel cut pattern 322 that separates the dummy pattern may be omitted and the mandrel etched region 321 may be formed as a full track a partial section (e.g., the "321DP" region). In the drawings, the second pattern block layer BA2 is illustrated integrally with the pattern block layer 240 nearby, but a shape of the second pattern block layer BA2 is not limited thereto. According to an embodiment, the second pattern block layer BA2 may have a shape physically separated from the adjacent pattern block layer 240.

Referring to FIG. 10C, some of the plurality of second patterns 112 may be spaced apart from each other by the second blocking region 22 corresponding to the second pattern block layer BA2. Ends of the second patterns 112 adjacent to the second blocking region 22 may have a different shape from ends of the second patterns 112 adjacent to the second blocking gap 21. For example, ends of the second patterns 112 adjacent to the second blocking region 22 have a concave shape, while ends of the second patterns 112 adjacent to the second blocking gap 21 have a convex shape. According to the present embodiment, by removing the dummy pattern included in the plurality of second pattern regions 20, the pattern density may be further lowered and a degradation of performance of the semiconductor device may be minimized. In addition, a process margin may be secured by forming the plurality of second patterns 112 without a dummy pattern through a full track process.

By way of summation and review, embodiments provide a semiconductor device having an improved process margin and minimized degradation of performance. That is, as set forth above, according to embodiments, it is possible to provide a semiconductor device having an improved process margin by minimizing a change in pitch between interconnections. In addition, it is possible to provide a semiconductor device in which degradation of performance is minimized by removing the dummy pattern in the region in which interconnections are dense.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower structure;
a first interlayer dielectric (ILD) on the lower structure;
first pattern regions extending inside the first ILD in a first direction, the first pattern regions being spaced apart from each other in a second direction perpendicular to the first direction, each of the first pattern regions including at least one first pattern; and
second pattern regions extending inside the first ILD in the first direction, the second pattern regions being spaced apart from each other in the second direction and alternating with the first pattern regions in the second direction, and each of the second pattern regions including at least one second pattern,
wherein each of the first pattern regions has a first width in the second direction, the first width is defined by a first line width of the at least one first pattern in the second direction,
wherein each of the second pattern regions has a second width in the second direction, the second width is defined by a second line width of the at least one second pattern in the second direction,
wherein the at least one first pattern has both ends opposite to each other in the first direction,
wherein the both ends of the at least one first pattern are concave inwardly along the first direction,
wherein each of the at least one first pattern has a first uniform line width in the second direction, and
wherein each of the at least one second pattern has a second uniform line width in the second direction.

2. The semiconductor device as claimed in claim 1, wherein both ends of the at least one second pattern are convex in the first direction.

3. The semiconductor device as claimed in claim 1, wherein:
at least one of the first pattern regions includes first patterns overlapping each other in the first direction, the first patterns being separated from each other by a first interval including a first blocking gap filled with the first ILD,
at least one of the second pattern regions includes second patterns overlapping each other in the first direction, the second patterns being separated from each other by a second interval including a second blocking gap filled with the first ILD, and
the first interval and the second interval are substantially equal to each other.

4. The semiconductor device as claimed in claim 3, further comprising a blocking region at an end of at least one of the first patterns in the first direction, the blocking region being filled with the first ILD and having a length greater than that of the first interval.

5. The semiconductor device as claimed in claim 1, wherein:
at least one of the second pattern regions includes second patterns overlapping each other in the first direction, the second patterns being separated from each other by a second blocking gap filled with the first ILD, and the second patterns have substantially a same line width in the second direction.

6. The semiconductor device as claimed in claim 1, wherein a pattern density of the at least one first pattern in the first pattern regions is lower than a pattern density of the at least one second pattern in the second pattern regions.

7. The semiconductor device as claimed in claim 1, wherein:
at least one of the second pattern regions includes second patterns overlapping each other in the first direction, the second patterns being separated from each other by a second blocking gap filled with the first ILD, and
at least two of the second patterns are dummy patterns electrically insulated from the lower structure.

8. The semiconductor device as claimed in claim 1, further comprising a pair of power interconnections extending inside the first ILD in the first direction, the pair of power interconnections being spaced apart from each other in the second direction, and the first pattern regions and the second pattern regions being arranged between the pair of power interconnections.

9. The semiconductor device as claimed in claim 1, wherein the lower structure includes:
a semiconductor substrate;
active regions extending on the semiconductor substrate in the first direction;
a gate structure crossing the active regions and extending in the second direction; and
source/drain regions on the active regions arranged adjacent to opposite sides of the gate structure.

10. The semiconductor device as claimed in claim 9, wherein at least one of the at least one first pattern and the at least one second pattern is electrically connected to the gate structure or the source/drain regions.

11. The semiconductor device as claimed in claim 1, further comprising: a second ILD on the first ILD; and
third and fourth pattern regions alternately disposed and spaced apart from each other inside the second ILD, the third and fourth pattern regions including at least one third pattern and at least one fourth pattern, respectively.

12. The semiconductor device as claimed in claim 11, wherein the third and fourth pattern regions extend in the second direction.

13. The semiconductor device as claimed in claim 11, wherein: opposite ends of the at least one third pattern are concave, and
opposite ends of the at least one fourth pattern are convex.

14. A semiconductor device, comprising:
a pair of power interconnections extending in a first direction and spaced apart from each other in a second direction perpendicular to the first direction;
first and second pattern regions extending in the first direction between the pair of power interconnections, the first and second pattern regions being alternately arranged in the second direction, and the first and second pattern regions including first patterns and second patterns, respectively, separated by blocking gaps in the first direction; and
spacer regions arranged between the pair of power interconnections and the first and second pattern regions,
wherein a pattern density of the first patterns is lower than a pattern density of the second patterns in a region between the pair of power interconnections,
wherein each of the first pattern regions has a first width in the second direction, the first width is defined by a first line width of each of the first patterns in the second direction, wherein each of the second pattern regions has a second width in the second direction, the second width is defined by a second line width of each of the second patterns in the second direction, wherein each of the spacer regions has a third width in the second direction, the third width is defined by a gap between one of the first pattern regions and one of the second pattern regions that are adjacent to each other, wherein each of the first patterns has both ends opposite to each other in the first direction, wherein the both ends of each of the first patterns are concave inwardly along the first direction, wherein each of the first patterns has both ends concave inwardly in the first direction, and wherein each of the second patterns has both ends convex inwardly in the first direction.

15. The semiconductor device as claimed in claim 14, wherein at least one of the first pattern regions further includes a blocking region in which the first patterns are not arranged.

* * * * *